US011973096B2

(12) United States Patent
Iida et al.

(10) Patent No.: US 11,973,096 B2
(45) Date of Patent: Apr. 30, 2024

(54) SOLID-STATE IMAGING ELEMENT, SOLID-STATE IMAGING ELEMENT PACKAGE, AND ELECTRONIC EQUIPMENT

(71) Applicant: SONY SEMICONDUCTOR SOLUTIONS CORPORATION, Kanagawa (JP)

(72) Inventors: Satoko Iida, Kanagawa (JP); Tomohiko Asatsuma, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 468 days.

(21) Appl. No.: 17/285,691

(22) PCT Filed: Oct. 11, 2019

(86) PCT No.: PCT/JP2019/040173
§ 371 (c)(1),
(2) Date: Apr. 15, 2021

(87) PCT Pub. No.: WO2020/085116
PCT Pub. Date: Apr. 30, 2020

(65) Prior Publication Data
US 2021/0343771 A1    Nov. 4, 2021

(30) Foreign Application Priority Data
Oct. 26, 2018    (JP) .................................. 2018-201497

(51) Int. Cl.
*H01L 27/146*    (2006.01)
(52) U.S. Cl.
CPC .. *H01L 27/14623* (2013.01); *H01L 27/14634* (2013.01); *H01L 27/14636* (2013.01);
(Continued)

(58) Field of Classification Search
CPC ......... H01L 27/14623; H01L 27/14601; H01L 27/14618; H01L 27/14625
See application file for complete search history.

(56) References Cited

U.S. PATENT DOCUMENTS

| 2012/0205766 A1 | 8/2012 | Takachi et al. |
| 2016/0301885 A1 | 10/2016 | Masuda et al. |
| 2019/0206925 A1 | 7/2019 | Yamamoto et al. |

FOREIGN PATENT DOCUMENTS

| JP | 2002-231921 | 8/2002 |
| JP | 2009-140948 | 6/2009 |

(Continued)

OTHER PUBLICATIONS

International Search Report prepared by the Japan Patent Office dated Nov. 6, 2019, for International Application No. PCT/JP2019/040173.

*Primary Examiner* — David A Zarneke
(74) *Attorney, Agent, or Firm* — SHERIDAN ROSS P.C.

(57) ABSTRACT

The present technology relates to a solid-state imaging element, a solid-state imaging element package, and electronic equipment that can suppress occurrence of flares. The solid-state imaging element includes an effective pixel region and a peripheral circuit region. The effective pixel region includes a plurality of pixels arranged two-dimensionally in a matrix pattern. The peripheral circuit region is provided around the effective pixel region. The effective pixel region has a pixel-to-pixel light-shielding film formed at boundary portions between the pixels. In a region on a substrate where a rib structure is formed within the peripheral circuit region, no light-shielding film is formed in the same layer as the pixel-to-pixel light-shielding film. The present technology is applicable, for example, to a solid- (Continued)

state imaging element package including a cover glass that protects a light-receiving surface of the solid-state imaging element.

19 Claims, 14 Drawing Sheets

(52) U.S. Cl.
CPC .... *H01L 27/1464* (2013.01); *H01L 27/14601* (2013.01); *H01L 27/14618* (2013.01); *H01L 27/14625* (2013.01)

(56) References Cited

FOREIGN PATENT DOCUMENTS

| | | |
|---|---|---|
| JP | 2012-164870 | 8/2012 |
| JP | 2012-169488 | 9/2012 |
| JP | 2013026565 A | 2/2013 |
| JP | 2018-046040 | 3/2018 |
| TW | 201320317 A | 5/2013 |
| TW | I629776 B | 7/2018 |
| WO | WO 2014/156657 | 10/2014 |
| WO | WO 2018/139278 | 8/2018 |
| WO | WO-2018139279 A1 | 8/2018 |

SOLID-STATE IMAGING ELEMENT, SOLID-STATE IMAGING ELEMENT PACKAGE, AND ELECTRONIC EQUIPMENT

CROSS REFERENCE TO RELATED APPLICATIONS

This application is a national stage application under 35 U.S.C. 371 and claims the benefit of PCT Application No. PCT/JP2019/040173 having an international filing date of 11 Oct. 2019, which designated the United States, which PCT application claimed the benefit of Japanese Patent Application No. 2018-201497, filed 26 Oct. 2018, the entire disclosures of each of which are incorporated herein by reference.

TECHNICAL FIELD

The present technology relates to a solid-state imaging element, a solid-state imaging element package, and electronic equipment, and particularly, to a solid-state imaging element, a solid-state imaging element package, and electronic equipment that can suppress occurrence of flares.

BACKGROUND ART

There is provided an image sensor having a light-shielding film formed on a peripheral circuit section outside an effective pixel region that converts incident light to prevent incident light from entering peripheral circuitry (refer, for example, to PTL 1).

CITATION LIST

Patent Literature

[PLT 1]
JP 2012-164870A

SUMMARY

Technical Problem

However, diagonal incident light entering from the effective pixel region may enter the effective pixel region again after reflection by a light-shielding film formed in the peripheral circuit section, thus entering the photoelectric conversion section and resulting in flares.

The present technology has been devised in light of such circumstances, and it is an object of the present technology to suppress occurrence of flares.

Solution to Problem

A solid-state imaging element of a first aspect of the present technology includes an effective pixel region and a peripheral circuit region. The effective pixel region includes a plurality of pixels arranged two-dimensionally in a matrix pattern. The peripheral circuit region is provided around the effective pixel region. The effective pixel region has a pixel-to-pixel light-shielding film formed at boundary portions between the pixels. In a region on a substrate where a rib structure is formed within the peripheral circuit region, no light-shielding film is formed in the same layer as the pixel-to-pixel light-shielding film.

A solid-state imaging element package of a second aspect of the present technology includes a solid-state imaging element, a transparent substrate, and a rib structure. The transparent substrate protects the solid-state imaging element. The rib structure is formed on a substrate of the solid-state imaging element to support the transparent substrate. The solid-state imaging element includes an effective pixel region and a peripheral circuit region. The effective pixel region has a pixel-to-pixel light-shielding film formed at boundary portions between the pixels. The peripheral circuit region is provided around the effective pixel region. In a region on the substrate where the rib structure is formed within the peripheral circuit region, no light-shielding film is formed in the same layer as the pixel-to-pixel light-shielding film.

Electronic equipment of a third aspect of the present technology includes a solid-state imaging element. The solid-state imaging element includes an effective pixel region and a peripheral circuit region. The effective pixel region includes a plurality of pixels arranged two-dimensionally in a matrix pattern. The peripheral circuit region is provided around the effective pixel region. The effective pixel region has a pixel-to-pixel light-shielding film formed at boundary portions between the pixels. In a region on a substrate where a rib structure is formed within the peripheral circuit region, no light-shielding film is formed in the same layer as the pixel-to-pixel light-shielding film.

In the first to third aspects of the present technology, an effective pixel region and a peripheral circuit region are provided. The effective pixel region includes a plurality of pixels arranged two-dimensionally in a matrix pattern. The peripheral circuit region is provided around the effective pixel region. The effective pixel region has a pixel-to-pixel light-shielding film formed at boundary portions between the pixels. In a region on a substrate where a rib structure is formed within the peripheral circuit region, no light-shielding film is formed in the same layer as the pixel-to-pixel light-shielding film.

The solid-state imaging element, the solid-state imaging element package, and the electronic equipment may be independent apparatuses or modules incorporated in other apparatus.

DESCRIPTION OF EMBODIMENTS

Figure 1:
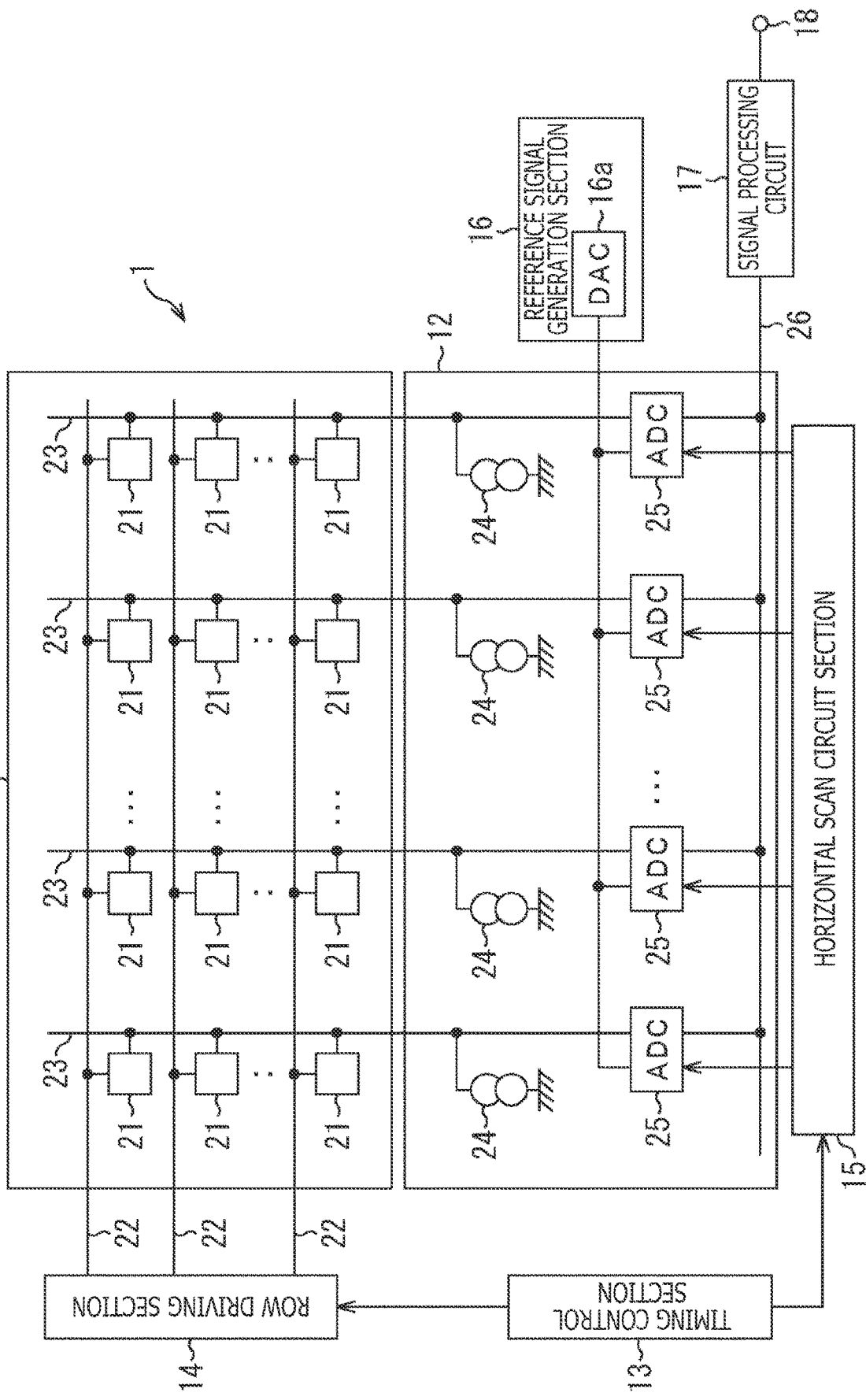
FIG. 1 is a block diagram illustrating a schematic configuration of a solid-state imaging element to which the present technology is applied.

A description will be given below of modes for carrying out the present technology (hereinafter referred to as embodiments). It should be noted that the description will be given in the following order:

1. Overall configuration example of the solid-state imaging element
2. Examples of detailed configurations of the pixel and the ADC
3. Configuration example of the first embodiment of the solid-state imaging element package
4. Sectional configuration example of the solid-state imaging element
5. Sectional view of the comparative example
6. Plan views of the substrates
7. Modification example of the first embodiment
8. Configuration example of the second embodiment of the solid-state imaging element package
9. Configuration example of the third embodiment of the solid-state imaging element package
10. Example of application to electronic equipment
11. Example of application to mobile object

1. Overall Configuration Example of the Solid-State Imaging Element

FIG. 1 is a block diagram illustrating a schematic configuration of a solid-state imaging element to which the present technology is applied.

A solid-state imaging element 1 illustrated in FIG. 1 includes a pixel array section 11, a column signal processing section 12, a timing control section 13, a row driving section 14, a horizontal scan circuit section 15, a reference signal generation section 16, a signal processing circuit 17, and an output section 18.

The pixel array section 11 has a plurality of pixels 21 arranged two-dimensionally in a matrix pattern.

The plurality of pixels 21 arranged in a matrix pattern is connected to the row driving section 14 on a row-by-row basis, by a horizontal signal line 22. In other words, the plurality of pixels 21 arranged in the same row within the pixel array section 11 is connected to the row driving section 14 by the same horizontal signal line 22. It should be noted that although depicted as a single interconnect in FIG. 1, the horizontal signal line 22 is not limited to a single interconnect.

Each of the pixels 21 in the pixel array section 11 outputs, to a vertical signal line 23, a pixel signal proportional to charge accumulated therein according to a signal supplied from the row driving section 14 via the horizontal signal line 22. An example of a detailed configuration of the pixel 21 will be described later with reference to FIG. 2. The plurality of pixels 21 arranged in the same column within the pixel array section 11 is connected to the same single vertical signal line 23, and a pixel signal output from each of the pixels 21 is supplied to the column signal processing section 12 via the vertical signal line 23.

The column signal processing section 12 includes a processing section that processes a pixel signal supplied via the vertical signal line 23 for each of the pixel columns of the pixel array section 11. For example, the column signal processing section 12 includes a constant current source circuit 24, an ADC (analog-digital converter) 25, and the like. The constant current source circuit 24 is connected to the vertical signal line 23, thus forming a source-follower circuit with the pixel 21. The constant current source circuit 24 includes a load MOS or the like. The ADC 25 performs a CDS (Correlated Double Sampling) process on a pixel signal supplied from the pixel 21 via the vertical signal line 23 and further performs an AD conversion process. Each of the ADCs 25 temporarily stores post-AD-conversion pixel data and outputs the data to a horizontal output line 26 under control of the horizontal scan circuit section 15.

The timing control section 13 supplies a clock signal and a timing signal, required for predetermined actions, to the row driving section 14, the horizontal scan circuit section 15, and the like on the basis of a master clock at a predetermined frequency. For example, the timing control section 13 supplies timing signals for shutter action and readout action of the pixel 21 to the row driving section 14, the horizontal scan circuit section 15, and the like. Also, although not illustrated, the timing control section 13 supplies clock and timing signals required for predetermined actions to the column signal processing section 12, the reference signal generation section 16, and the like.

The row driving section 14 includes, for example, a row decoder section and a row driving circuit section. The row decoder section determines a row position for driving the pixels. The row driving circuit section generates driving signals for driving the pixels 21 and supplies the signals to the pixels 21 via the horizontal signal lines 22.

The horizontal scan circuit section 15 causes pixel data, stored in the plurality of ADCs 25 inside the column signal processing section 12, to be output one after another to the horizontal output line 26 at predetermined timings.

The reference signal generation section 16 includes a DAC (Digital to Analog Converter) 16a, generating a ramp wave reference signal according to a clock signal from the timing control section 13 and suppling the signal to each of the ADCs 25 in the column signal processing section 12.

The signal processing circuit 17 performs a variety of digital signal processing tasks on pixel data of each of the pixels 21 supplied via the horizontal output line 26 such as a black level adjustment process, a column variation correction process, and a grayscale correction process, supplying the data to the output section 18. Also, the signal processing circuit 17 may simply buffer pixel data and output the data to the output section 18. The output section 18 outputs the pixel data, supplied from the signal processing circuit 17, to equipment outside the apparatus.

The solid-state imaging element 1 configured as described above is a CMOS image sensor referred to as a column AD type that has the ADC 25 for handling the CDS and AD processes provided for each pixel column.

2. Examples of Detailed Configurations of the Pixel and the ADC

A description will be given next of detailed configurations of the pixel 21 and the ADC 25 with reference to FIG. 2.

Figure 2:
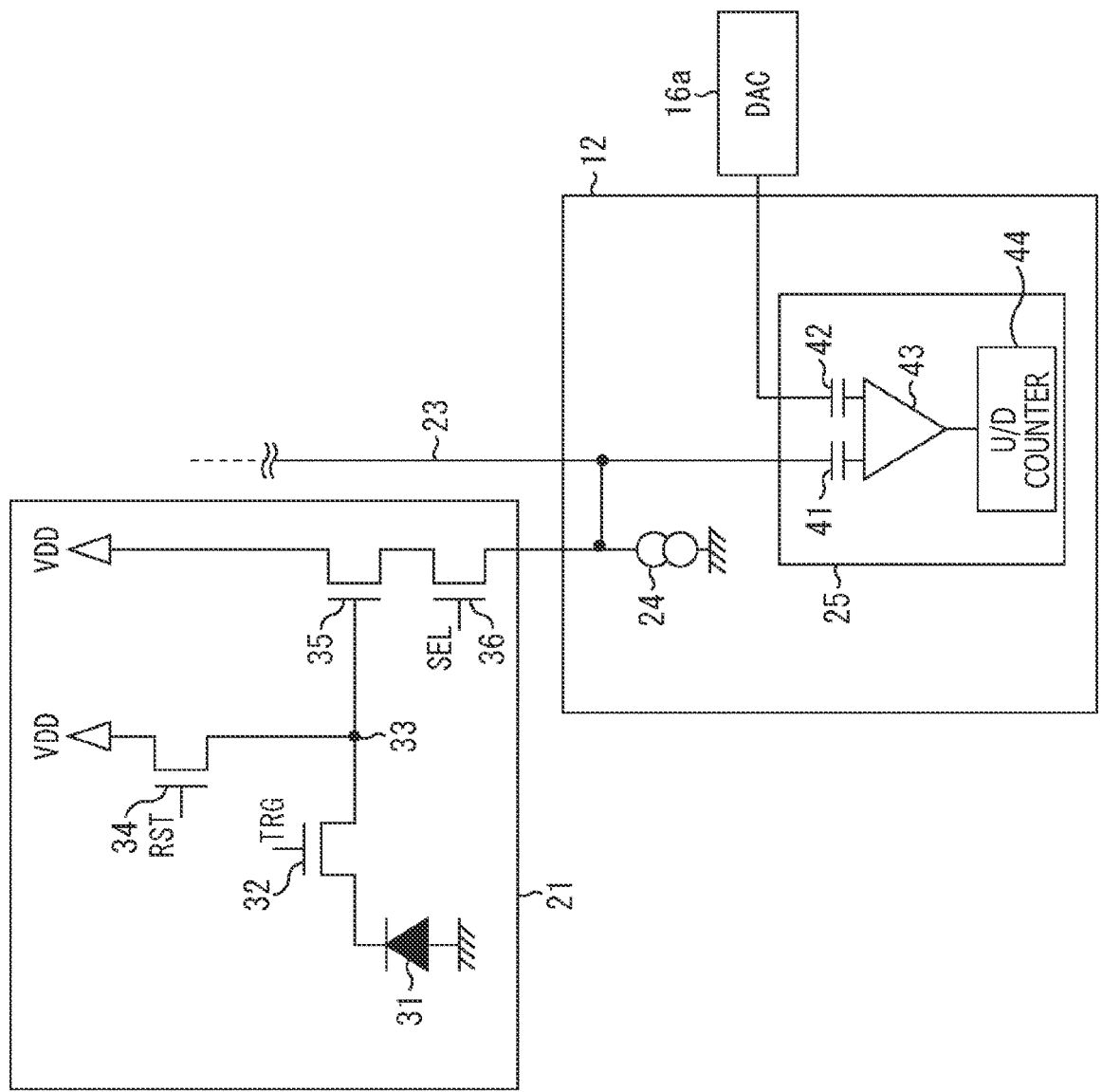
FIG. 2 is a block diagram illustrating detailed configurations of a pixel and an ADC.

FIG. 2 illustrates a detailed configuration of one of the pixels 21, provided in the pixel array section 11 and connected to one of the vertical signal lines 23, and that of the column signal processing section 12.

The pixel 21 includes a photodiode 31 as a photoelectric conversion element, a transfer transistor 32, an FD (Floating Diffusion) 33, a reset transistor 34, an amplifying transistor 35, and a selection transistor 36.

The photodiode 31 generates charge (signal charge) proportional to an amount of light received and stores the charge. The photodiode 31 has its anode terminal grounded and its cathode terminal connected to the FD 33 via the transfer transistor 32.

When turned ON by a transfer signal TRG, the transfer transistor 32 reads out charge generated by the photodiode 31 and transfers the charge to the FD 33.

The FD 33 retains the charge read out from the photodiode 31. When the reset transistor 34 is turned ON by a reset signal RST, charge accumulated in the FD 33 is discharged into a drain (constant voltage source VDD) of the reset transistor 34, thus resetting a potential of the FD 33.

The amplifying transistor 35 outputs a pixel signal proportional to the potential of the FD 33. That is, the amplifying transistor 35 configures a source-follower circuit with the constant current source circuit 24 connected via the vertical signal line 23, outputting a pixel signal representing a level proportional to the charge accumulated in the FD 33 to the ADC 25 from the amplifying transistor 35 via the selection transistor 36 and the vertical signal line 23.

The selection transistor 36 is turned ON when the pixel 21 is selected by a selection signal SEL, outputting a pixel signal of the pixel 21 to the ADC 25 via the vertical signal line 23. Each of the signal lines through which the transfer signal TRG, the selection signal SEL, and the reset signal RST are transmitted corresponds to the horizontal signal line 22 illustrated in FIG. 1.

The pixel 21 can have, for example, a configuration as described above. However, the pixel 21 is not limited to this configuration and may adopt other configuration.

The ADC 25 includes capacitive elements (capacitors) 41 and 42, a comparator 43, and an up/down counter (U/D counter) 44.

The pixel signal output from the pixel 21 is input to the capacitive element 41 of the ADC 25 via the vertical signal line 23. Meanwhile, what is generally called a ramp wave reference signal whose level (voltage) changes in an inclined manner with time is input to the capacitive element 42 from the DAC 16a of the reference signal generation section 16.

It should be noted that the capacitive elements 41 and 42 are designed to remove DC components from the reference signal and the pixel signal such that the comparator 43 can compare the reference signal and the pixel signal in terms of their AC components only.

The comparator 43 outputs, to the up/down counter 44, a difference signal obtained as a result of comparison between the pixel signal and the reference signal. For example, in the case where the reference signal is larger than the pixel signal, a Hi (High) difference signal is supplied to the up/down counter 44, and in the case where the reference signal is smaller than the pixel signal, a Lo (Low) difference signal is supplied to the up/down counter 44.

The up/down counter (U/D counter) 44 counts down only while a Hi difference signal is supplied during a P-phase (Preset Phase) AD conversion period and counts up only while a Hi difference signal is supplied during a D-phase (Data Phase) AD conversion period. Then, the up/down counter 44 outputs a result of addition of the down-count value during the P-phase AD conversion period and the up-count value during the D-phase AD conversion period as post-CDS-and-AD-conversion pixel data. It should be noted that the up/down counter 44 may count up during the P-phase AD conversion period and count down during the D-phase AD conversion period.

3. Configuration Example of the First Embodiment of the Solid-State Imaging Element Package FIG. 3 is a sectional view illustrating a configuration example of a first embodiment of a solid-state imaging element package obtained by packaging the solid-state imaging element 1 described above.

Figure 3:
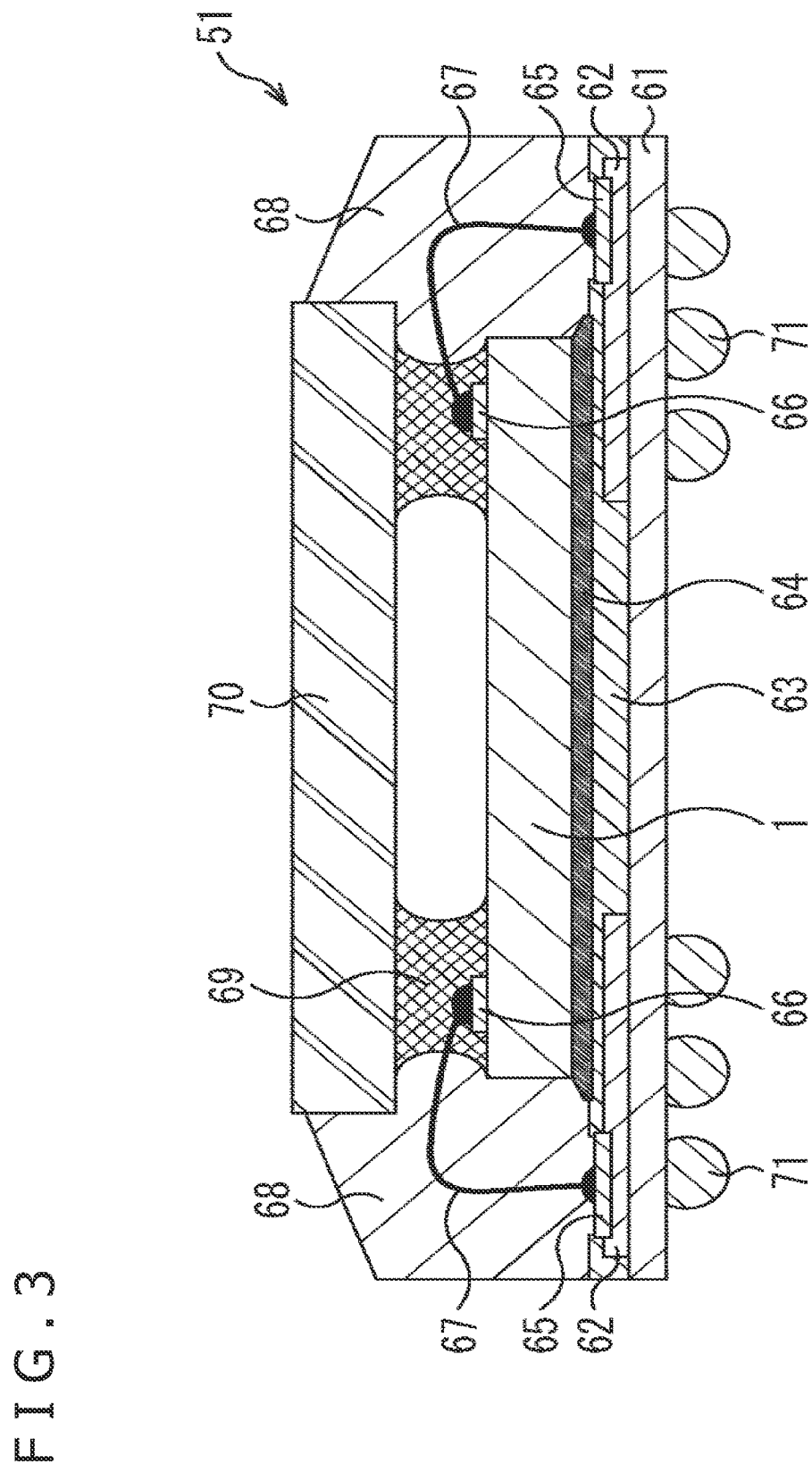
FIG. 3 is a sectional view illustrating a configuration example of a first embodiment of a solid-state imaging element package.

A solid-state imaging element package 51 illustrated in FIG. 3 is configured by bonding the solid-state imaging element 1 to an upper surface of a support substrate 61 with adhesive 64 and protecting an upper side, a light-receiving side, of the solid-state imaging element 1 with a cover glass (transparent substrate) 70. It should be noted that a transparent substrate that passes light such as an acrylic resin substrate may also be used instead of the cover glass 70 as a protective substrate for protecting the solid-state imaging element 1.

An interposer substrate 62 is fastened to an upper surface of the support substrate 61, and upper surfaces of the interposer substrate 62 and the support substrate 61 are covered with a solder mask 63. The solid-state imaging element 1 is bonded to an upper surface of the solder mask 63 via the adhesive 64, and pads (electrodes) 66 formed on the upper surface of the solid-state imaging element 1 and pads (electrodes) 65 formed on the interposer substrate 62 are electrically connected by bonding wires 67.

A rib structure 69 is disposed on a peripheral portion of the upper surface of the solid-state imaging element 1. The rib structure 69 bonds the solid-state imaging element 1 and the cover glass 70 together and supports the cover glass 70. A resin material having a physical property to absorb light, in other words, a resin material having an attenuation coefficient, is used as a material of the rib structure 69.

The solid-state imaging element 1 is formed smaller in planar size than the support substrate 61 and bonded to a center portion of the support substrate 61. The cover glass 70 is approximately the same in planar size as the solid-state imaging element 1. Lateral sides of the solid-state imaging element 1, the rib structure 69, and the cover glass 70 and above the support substrate 61 with no solid-state imaging element 1 or no cover glass 70 provided are covered with a mold resin 68. The bonding wires 67 electrically connecting the pads 66 of the solid-state imaging element 1 and the pads 65 of the interposer substrate 62 penetrate the rib structure 69 and the mold resin 68.

Solder balls 71, input/output sections of the solid-state imaging element package 51 for inputting and outputting output signals, power, and the like of the solid-state imaging element 1 are formed on a lower side of the support substrate 61.

The solid-state imaging element package 51 illustrated in FIG. 3 has a construction whose package size in the planar direction has been reduced by allowing the bonding wires 67 to penetrate the rib structure 69 and the mold resin 68. This realizes downsizing of the image sensor chip and the package.

4. Sectional Configuration Example of the Solid-State Imaging Element

A description will be given next of a detailed internal construction of the solid-state imaging element 1 illustrated in FIG. 3 with reference to FIG. 4.

Figure 4:
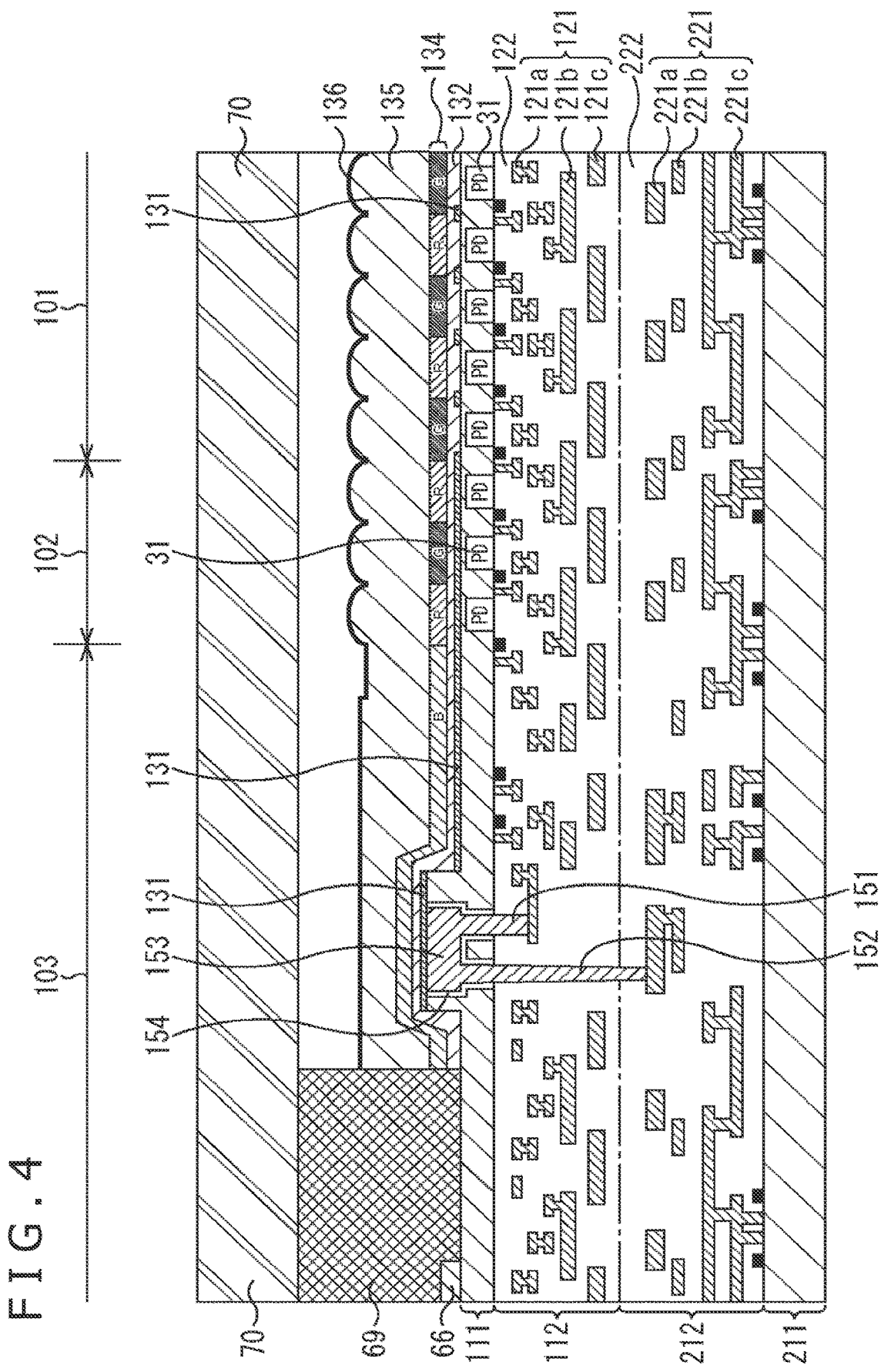
FIG. 4 is a sectional view illustrating a detailed construction of a solid-state imaging element according to the first embodiment.

FIG. 4 is a sectional view illustrating a detailed construction of the solid-state imaging element 1 illustrated in FIG. 3.

FIG. 4 illustrates partial sectional constructions of the solid-state imaging element 1, the cover glass 70, and the rib structure 69 supporting the cover glass 70.

The solid-state imaging element 1 is divided, in the planar direction, into an effective pixel region 101 and an OPB pixel region 102 that are included in the pixel array section 11 and a peripheral circuit region 103 around the pixel array section 11. The effective pixel region 101 is where the pixels 21 for outputting pixel signals as video signals are provided whereas the OPB pixel region 102 is where the pixels 21 (OPB pixels) for outputting black reference pixel signals for the video signals are provided. The peripheral circuit region 103 is where at least some of the column signal processing section 12, the timing control section 13, the row driving section 14, the horizontal scan circuit section 15, and the reference signal generation section 16 illustrated in FIG. 1 are provided.

The solid-state imaging element 1 includes two semiconductor substrates with their interconnect layers pasted together. More specifically, the solid-state imaging element 1 includes a first substrate 111 and a second substrate 211 with a multi-layer interconnect layer 112 of the first substrate 111 and a multi-layer interconnect layer 212 of the second substrate 211 pasted together. A long dashed short dashed line in FIG. 4 indicates a pasting surface between the multi-layer interconnect layer 112 and the multi-layer interconnect layer 212. Semiconductor substrates including silicon (Si), for example, are used as the first substrate 111 and the second substrate 211.

The multi-layer interconnect layer 212 of the second substrate 211 includes a plurality of interconnect layers 221 and an interlayer insulating film 222. The plurality of interconnect layers 221 includes an interconnect layer 221a in an uppermost layer closest to the first substrate 111, an intermediate interconnect layer 221b, an interconnect layer 221c in a lowermost layer closest to the second substrate 211, and the like. The interlayer insulating film 222 is formed between each pair of the interconnect layers 221.

The plurality of interconnect layers 221 includes, for example, copper (Cu), aluminum (Al), tungsten (W), or the like whereas the interlayer insulating film 222 includes, for example, a silicon oxide film, a silicon nitride film, or the like.

Also, a porous low dielectric constant material (hereinafter referred to as a low-k material) may be used for the interlayer insulating film 222. Typical examples of porous low-k materials are a porous SiOC film, a porous HSQ (Hydrogen Silsesquioxane) film, and a porous MSQ (Methyl Silsesquioxane) film. These low-k materials are formed by depositing a film component including a porogen through CVD or coating method first, followed by UV cure, plasma cure, thermal treatment, and electron beam cure, thus allowing for desorption of the porogen from the film component. Accordingly, each of these porous SiOC film, porous HSQ film, and porous MSQ film includes not only a plurality of holes of small mean diameter originally existing in each film but also a plurality of holes of large mean diameter formed as a result of the desorption of the porogen. It is possible to achieve better absorption (attenuation) of light entering the second substrate 211 by using a porous low-k material as the interlayer insulating film 222.

Each of the interconnect layers 221 and the interlayer insulating film 222 may include the same material regardless of the layer, or two or more materials may be used selectively depending on the layer. MOS transistors and the like are formed at an interface between the second substrate 211 and the multi-layer interconnect layer 212.

Meanwhile, the multi-layer interconnect layer 112 of the first substrate 111 includes a plurality of interconnect layers 121 and an interlayer insulating film 122. The plurality of interconnect layers 121 includes an interconnect layer 121a in an uppermost layer closest to the first substrate 111, an intermediate interconnect layer 121b, an interconnect layer 121c in a lowermost layer closest to the second substrate 211, and the like. The interlayer insulating film 122 is formed between each pair of the interconnect layers 121.

Materials of the same kind as those used as the interconnect layers 221 and the interlayer insulating film 222 may be used as the interconnect layers 121 and the interlayer insulating film 122. Also, the plurality of interconnect layers 121 and the interlayer insulating film 122 are similar to the interconnect layers 221 and the interlayer insulating film 222 described above in that they may include a single material or selectively two or more materials.

As described above, the solid-state imaging element 1 is a back-illuminated solid-state imaging element that includes two semiconductor substrates whose interconnect layers are pasted together into which light enters from a back side opposite to the side of the multi-layer interconnect layer 112, a front side of the first substrate 111. It should be noted that, although the multi-layer interconnect layer 112 of the first substrate 111 includes the five interconnect layers 121 and the multi-layer interconnect layer 212 of the second substrate 211 includes the four interconnect layers 221 in the example illustrated in FIG. 4, the number of interconnect layers is not limited thereto, and a desired number of layers may be formed.

The photodiodes 31, formed by PN junction, are formed, one for each pixel 21, in the first substrate 111 of the effective pixel region 101 and the OPB pixel region 102. Although not illustrated in detail, not only the plurality of pixel transistors such as the transfer transistors 32 and the amplifying transistors 35 but also the FDs 33 and the like are formed at the interface between the multi-layer interconnect layer 112 and the first substrate 111.

A light-shielding film 131 is formed in a predetermined region of an upper surface of the first substrate 111. In the effective pixel region 101, the light-shielding film 131 is formed at boundary portions between the plurality of pixels 21 and functions as a pixel-to-pixel light-shielding film for suppressing entry of light to the neighboring pixels. In the OPB pixel region 102, the light-shielding film 131 is formed over the entire region of the pixels 21 and functions as an OPB light-shielding film for suppressing entry of light. The pixels 21 over which the OPB light-shielding film is formed are also referred to as OPB pixels. In the peripheral circuit region 103, the light-shielding film 131 is formed in a region more on the side of the effective pixel region 101 than the region where the rib structure 69 is formed. Any material can be used as the light-shielding film 131 as long as it shields light, and a metallic material such as tungsten (W), aluminum (Al), or copper (Cu) can be used. The light-shielding film 131 is formed on the first substrate 111 of the effective pixel region 101, the OPB pixel region 102, and the peripheral circuit region 103 at the same time by the same process.

A planarizing film 132 including a TEOS film or the like is formed on top of the light-shielding film 131, and a color filter layer 134 and an OCL (On-Chip Lens) layer 135 are formed on an upper surface of the planarizing film 132. The OCL layer 135 has its outermost surface formed with a desired curvature in the effective pixel region 101 and the OPB pixel region 102 and formed flat in the peripheral circuit region 103. Although we assume that R (red), G (green), and B (blue) are arranged, for example, in Bayer pattern in the color filter layer 134, the colors may be arranged in other pattern. Although any of R, G, and B color filter layers may be formed in the peripheral circuit region 103, the B color filter layer 134 is formed in the example illustrated in FIG. 4. An anti-reflection film 136 including, for example, two layers, a hafnium oxide (HfO2) film and a silicon oxide film, is formed on an upper surface of the OCL layer 135.

The peripheral circuit region 103 is divided, in the planar direction, into two regions on the first substrate 111, one where the rib structure 69 supporting the cover glass 70 is formed and another where the color filter layer 134, the OCL layer 135, and the anti-reflection film 136 are formed as in the OPB pixel region 102.

A through-silicon electrode 151 and a through-chip electrode 152 are formed at predetermined positions where the OCL layer 135 and the like of the peripheral circuit region 103 are formed. The through-silicon electrode 151 is connected to the predetermined interconnect layer 121 on the side of the first substrate 111. The through-chip electrode 152 is connected to the predetermined interconnect layer 221 on the side of the second substrate 211. The through-silicon electrode 151 and the through-chip electrode 152 are connected by a connection interconnect 153 formed on an upper surface of the first substrate 111. The first substrate 111 and the second substrate 211 are electrically connected by the through-silicon electrode 151, the through-chip electrode 152, and the connection interconnect 153 for connecting these two through silicon vias (TSVs). It should be noted that each of the through-silicon electrode 151 and the through-chip electrode 152 and the first substrate 111 are insulated by an insulating film 154. A construction that achieves electrical connection between the first substrate 111 and the second substrate 211 by means of the through-silicon electrode 151 and the through-chip electrode 152 will be hereinafter referred to as a twin-contact construction.

In the peripheral circuit region 103, the same light-shielding film 131 as in the effective pixel region 101 and the OPB pixel region 102 is formed on an upper surface of the connection interconnect 153 and on the first substrate 111 more on the side of the OPB pixel region 102 than the connection interconnect 153. In the region where the rib structure 69 is formed on the first substrate 111, however, no light-shielding film 131 is formed at the same time and in the same layer as the pixel-to-pixel light-shielding film and the OPB light-shielding film.

5. Sectional View of the Comparative Example

Figure 5:
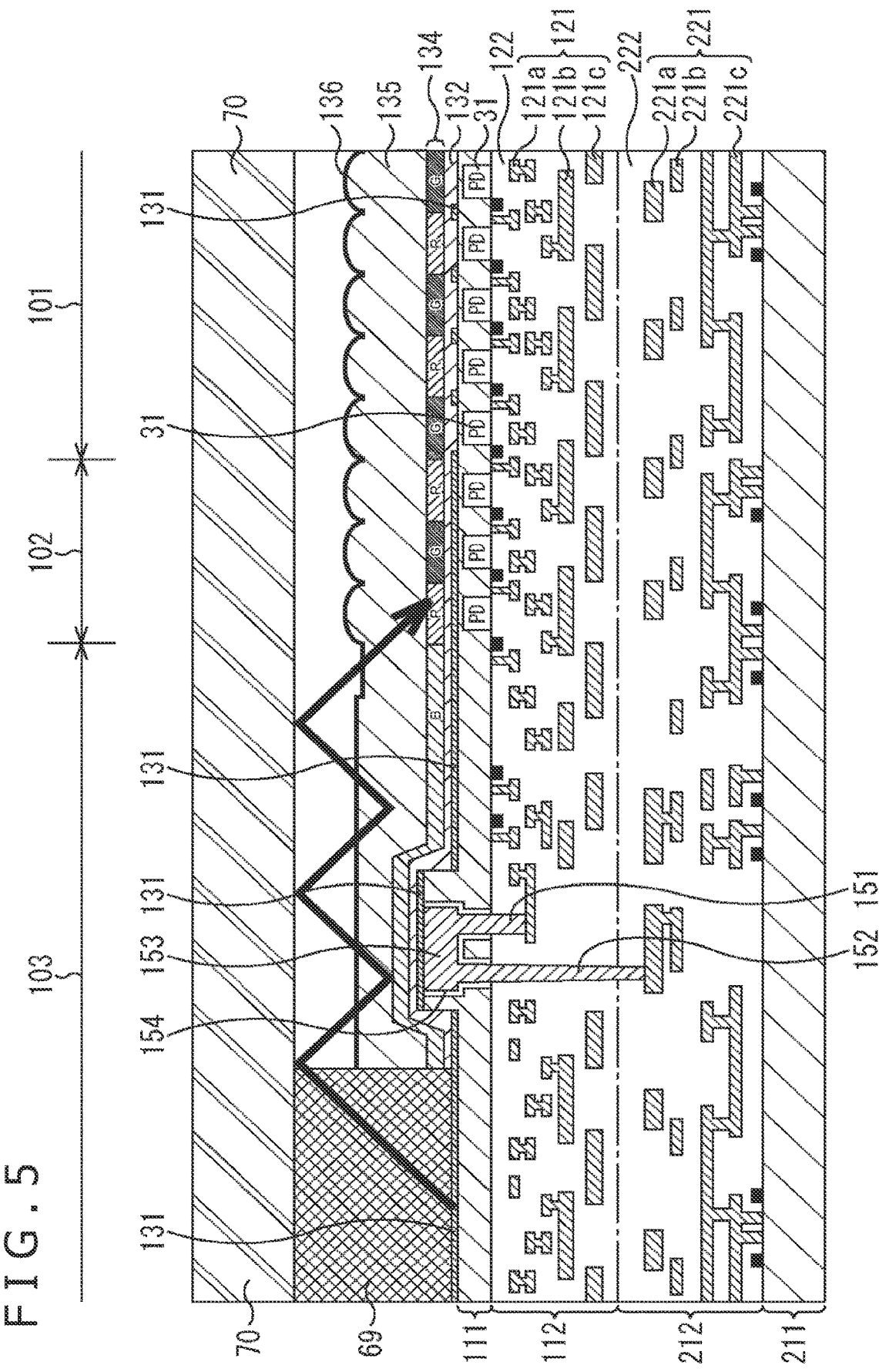
FIG. 5 is a sectional view illustrating a comparative example for comparison with the solid-state imaging element according to the first embodiment.

In contrast, a possible option would be a construction with the light-shielding film 131 formed over the entire surface of the first substrate 111 in the peripheral circuit region 103 including the region where the rib structure 69 is formed as illustrated in FIG. 5, for example.

FIG. 5 is a sectional view illustrating a comparative example for comparison with the solid-state imaging element 1 illustrated in FIG. 3.

In the case where the light-shielding film 131 is formed in the region under the rib structure 69 as illustrated in FIG. 5, diagonal incident light entering the rib structure 69 may be reflected by the light-shielding film 131 under the rib structure 69, entering into the effective pixel region 101 and causing flares.

In contrast, the construction of the solid-state imaging element 1 illustrated in FIG. 3 has no light-shielding film 131 formed in the region under the rib structure 69, thus ensuring that diagonal incident light entering the rib structure 69 enters the first substrate 111 and preventing the light from entering the effective pixel region 101 again, a cause of flares. That is, according to the construction of the solid-state imaging element 1 illustrated in FIG. 3, it is possible to suppress occurrence of flares. Also, in the solid-state imaging element 1 illustrated in FIG. 3, a resin material having an attenuation coefficient is used as a material of the rib structure 69, thus allowing nearly all light entering the rib structure 69 to be absorbed by the rib structure 69. This reduces light itself passing through the rib structure 69 and entering the first substrate 111.

Also, the solid-state imaging element 1 illustrated in FIG. 3 has a laminated construction including the first substrate 111 and the second substrate 211 pasted together. The laminated construction has a number of interconnect layers. As a result, even if light enters the first substrate 111, a distance in a laminating direction is long, allowing the light to be fully attenuated before it reaches the circuit region formed on the second substrate 211. This ensures that the circuitry formed on the second substrate 211 remains unaffected by light.

6. Plan Views of the Substrates

Figure 6:
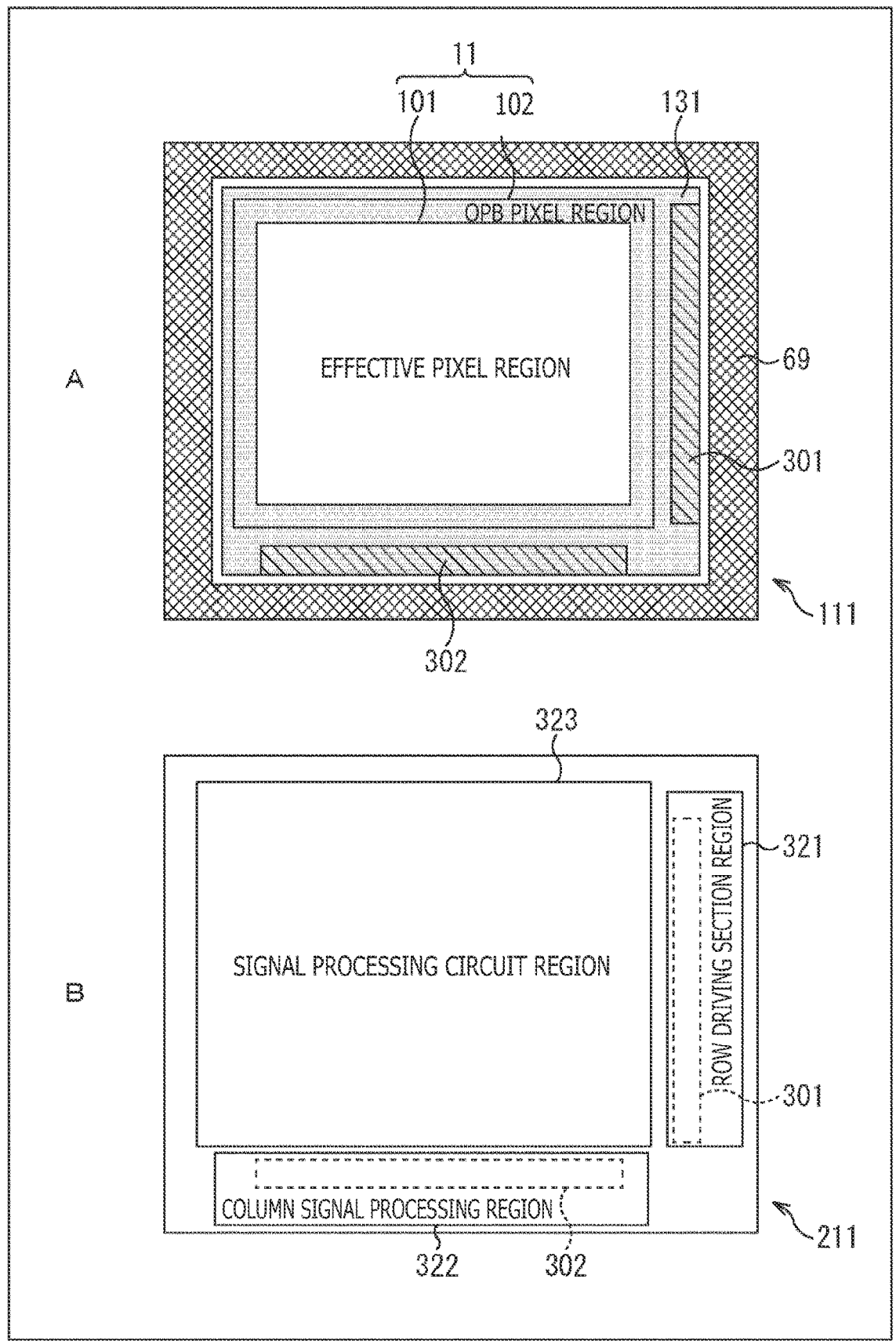
FIG. 6 depicts plan views illustrating layouts of each region formed on first and second substrates.

FIG. 6 depicts plan views illustrating layouts of each region formed on the first substrate 111 and the second substrate 211.

A of FIG. 6 illustrates a plan view of the first substrate 111.

On the first substrate 111, the effective pixel region 101 of the pixel array section 11 is disposed at a center portion whereas the OPB pixel region 102 is disposed outside the effective pixel region 101. Then, the peripheral circuit region 103 (not depicted in FIG. 6) spans from outside the OPB pixel region 102 to an edge portion of the first substrate 111.

The regions colored in gray, i.e., the OPB pixel region 102 and part of the peripheral circuit region 103 adjacent thereto, represent the regions where the light-shielding film 131 is formed. It should be noted that the portion of the light-shielding film 131 as a pixel-to-pixel light-shielding film in the effective pixel region 101 is not colored in gray in A of FIG. 6.

On the first substrate 111, contact regions 301 and 302, each having a twin-contact construction, are disposed in the vicinity of two of four sides of a periphery of the OPB pixel region 102. The light-shielding film 131 is also formed in these contact regions 301 and 302. The rib structure 69 is formed at the outermost periphery of the first substrate 111 that is more outward than the contact regions 301 and 302. As described above, the region of the rib structure 69 has no light-shielding film 131 formed therein.

B of FIG. 6 illustrates a plan view of the second substrate 211.

On the second substrate 211, a row driving section region 321 having circuitry of the row driving section 14 formed therein is disposed in such a manner as to overlap the contact region 301 formed at a position adjacent to the row direction of the pixel array section 11 on the first substrate 111.

Meanwhile, a column signal processing region 322 having circuitry including the column signal processing section 12 and the horizontal scan circuit section 15 formed therein is disposed in such a manner as to overlap the contact region 302 formed at a position adjacent to the column direction of the pixel array section 11 on the first substrate 111.

On the second substrate 211, a signal processing circuit region 323 having the signal processing circuit 17 formed therein is disposed in a region overlapping the effective pixel region 101 on the first substrate 111.

Among the circuits formed on the second substrate 211, those which act as floating nodes during a charge accumulation period such as the capacitive elements 41 and 42 of the ADC 25 and capacitive elements included in the DAC 16a and constant current source circuit 24 are formed under the region where the light-shielding film 131 is formed, a region more inward than the region where the rib structure 69 is formed on the first substrate 111. In this case, incident light does not reach the second substrate 211, making it possible to prevent the circuitry formed on the second substrate 211 from changing their characteristics due to photoelectric conversion. It should be noted that, in the case where circuitry that acts as floating nodes is disposed under the region where the rib structure 69 is formed on the first substrate 111, it is possible, as described above, to prevent changes in characteristics caused by photoelectric conversion according to the rib structure 69 including a resin material having an attenuation coefficient and a long distance to the circuit region made possible by a laminated construction of the first substrate 111 and the second substrate 211.

7. Modification Example of the First Embodiment

In the example described above, a construction is used in which the bonding wires 67 for electrically connecting the pads 66 of the solid-state imaging element 1 and the pads 65 of the interposer substrate 62 penetrated the rib structure 69 to downsize the image sensor and the package.

However, the construction for suppressing occurrence of flares described above is similarly applicable to the solid-state imaging element package 51 having a construction with the bonding wires 67 not penetrating the rib structure 69.

Figure 7:
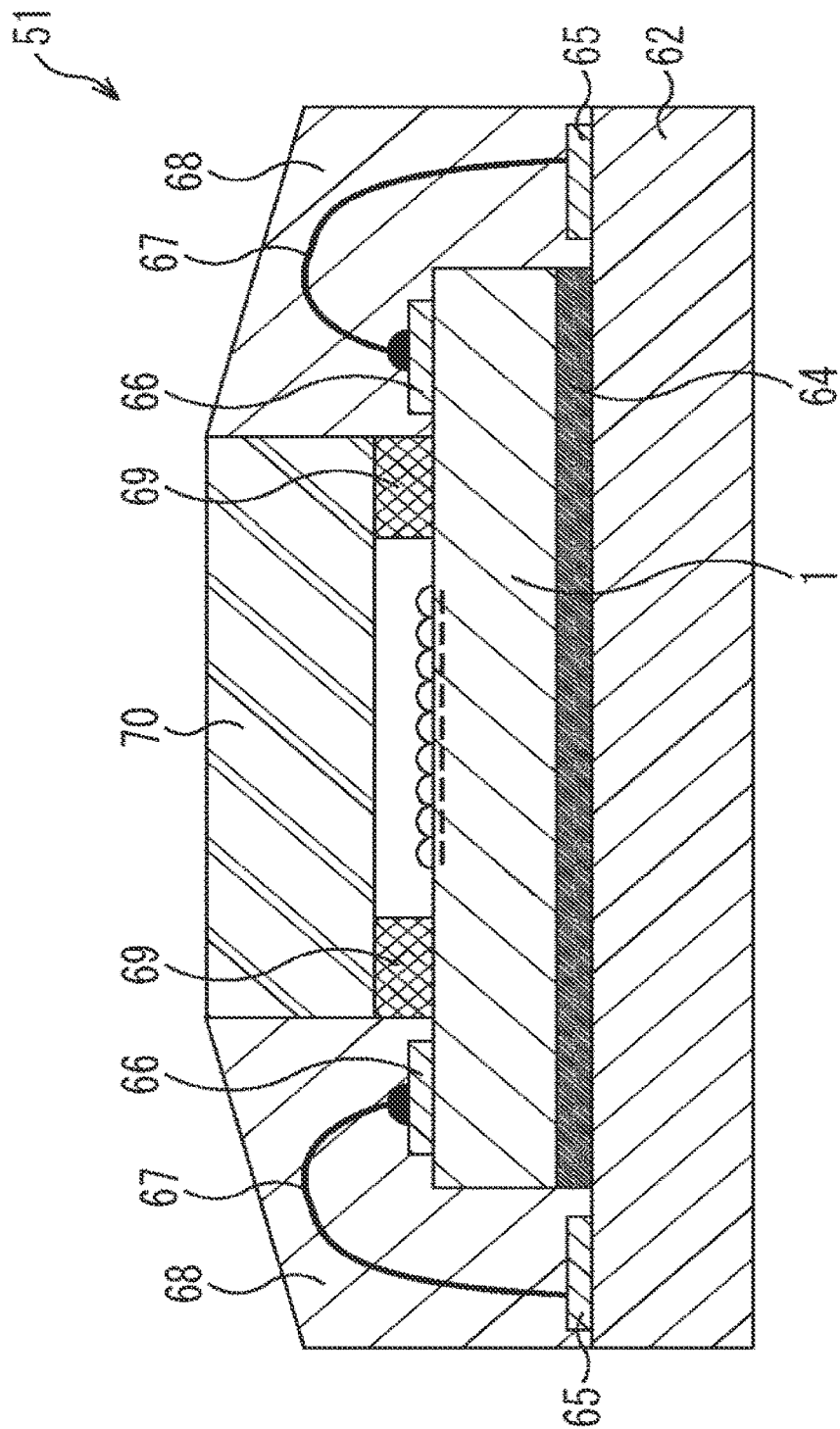
FIG. 7 is a sectional view of a solid-state imaging element package of a modification example of the first embodiment.

FIG. 7 is a sectional view of the solid-state imaging element package 51 whose bonding wires 67 do not penetrate the rib structure 69.

In FIG. 7, the portions corresponding to those in FIG. 3 are denoted by the same reference signs, and the description thereof will be omitted as appropriate.

In the sectional construction of the solid-state imaging element package 51 illustrated in FIG. 3, the cover glass 70 and the solid-state imaging element 1 are formed approximately at the same planar size, and the rib structure 69 supporting the cover glass 70 is formed on the periphery of the solid-state imaging element 1 as illustrated in FIG. 6.

In contrast, in the sectional construction of the solid-state imaging element package 51 illustrated in FIG. 7, the cover glass 70 is formed smaller in planar size than the solid-state imaging element 1, and the rib structure 69 supporting the cover glass 70 is disposed at a position more inward than the periphery of the solid-state imaging element 1. Then, the rib structure 69 and the pads 66 are disposed side by side in the planar direction on the upper surface of the solid-state imaging element 1, and the pads 66 are disposed more on the side of the periphery of the solid-state imaging element 1 than the rib structure 69. As a result, the bonding wires 67 for electrically connecting the pads 66 of the solid-state imaging element 1 and the pads 65 formed on the interposer substrate 62 do not penetrate the rib structure 69.

Even in the solid-state imaging element package 51 having a construction with the bonding wires 67 not penetrating the rib structure 69, the solid-state imaging element 1 has no light-shielding film 131 formed in the region under the rib structure 69 as illustrated in the construction of FIG. 4. This suppresses occurrence of flares.

8. Configuration Example of the Second Embodiment of the Solid-State Imaging Element Package FIG. 8 is a sectional view illustrating a configuration example of a second embodiment of a solid-state imaging element package.

Figure 8:
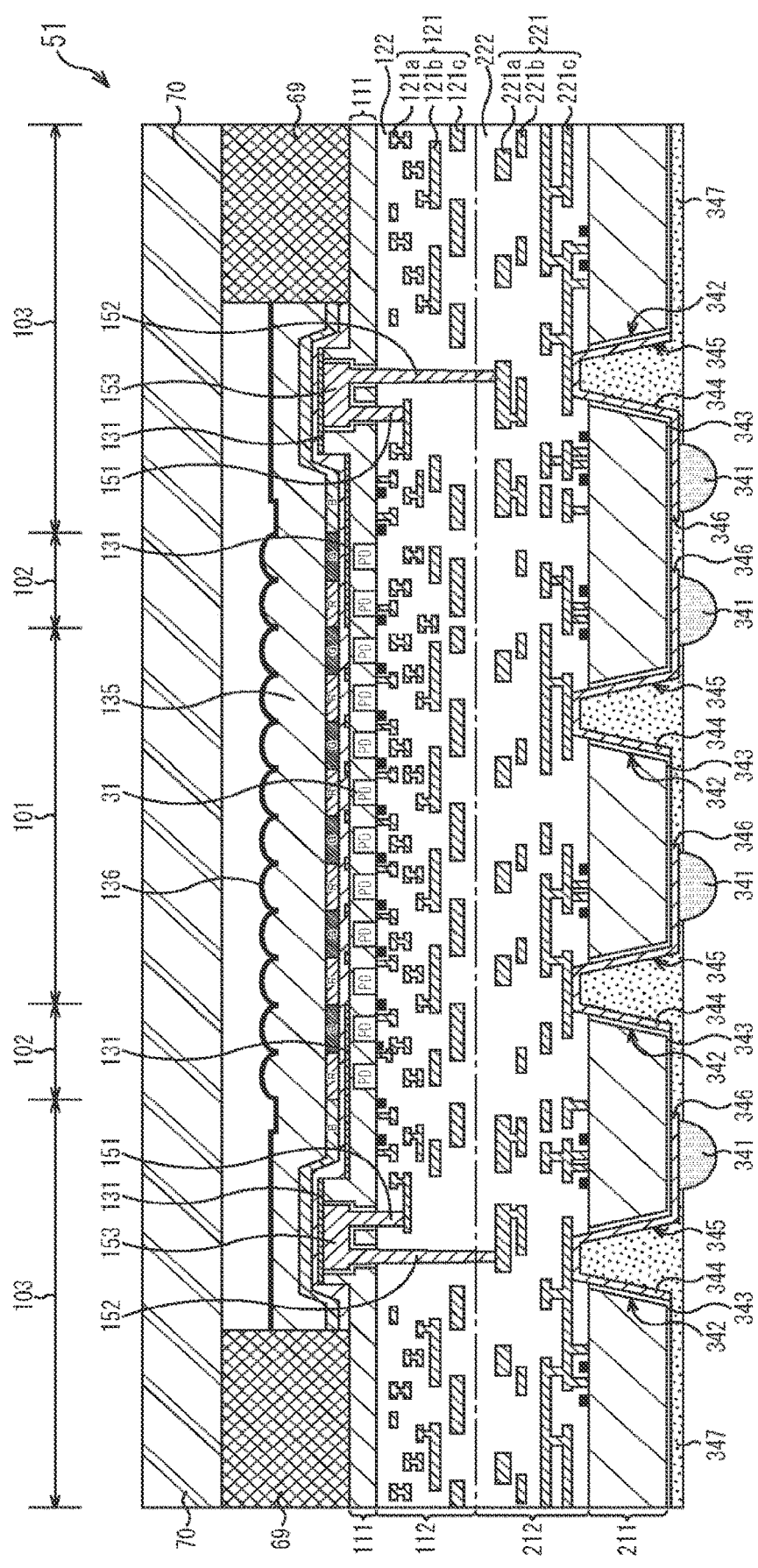
FIG. 8 is a sectional view illustrating a configuration example of a second embodiment of a solid-state imaging element package.

In FIG. 8, the portions corresponding to those in FIGS. 3 and 4 in the first embodiment are denoted by the same reference signs, and the description thereof will be omitted as appropriate.

The solid-state imaging element package 51 according to the second embodiment is formed as a WL-CSP (Wafer Level Chip Size Package).

A WL-CSP is formed by forming imaging element circuitry on a semiconductor substrate in a wafer state and fastening the semiconductor substrate having the imaging element circuitry to a glass substrate working as a cover glass, first followed by separation of the semiconductor substrate and the glass substrate into individual pieces. Accordingly, in the solid-state imaging element package 51 illustrated in FIG. 8, no bonding wires 67 or pads 66 are formed as in the first embodiment. Instead, solder balls 341 are formed as an input/output section of the solid-state imaging element 1 on a back surface of the second substrate 211 on the opposite side (bottom in FIG. 8) of the multi-layer interconnect layer 212 of the second substrate 211.

In more detail, through-silicon holes 342 that penetrate the second substrate 211 are formed at predetermined positions of the second substrate 211, and through vias 345 are formed by embedding a connection conductor 344 into an inner wall of each of the through-silicon holes 342 via an insulating film 343. The insulating film 343 can include, for example, a SiO2 film, a SiN film, or the like. Although in a reverse taper shape with the side of the multi-layer interconnect layer 212 smaller in planar area than the side of the solder balls 341 in FIG. 8, the through vias 345 may be conversely in a forward taper shape with the side of the solder balls 341 smaller in planar area. Alternatively, the through vias 345 may be conversely in a non-taper shape with the side of the solder balls 341 approximately the same in planar area as the side of the multi-layer interconnect layer 212.

The connection conductors 344 of the through vias 345 are electrically connected, for example, to an interconnect layer 221c, the lowermost layer in the multi-layer interconnect layer 212. Also, the connection conductors 344 are connected to re-distribution interconnects 346 formed on the side of the lower surface of the second substrate 211, and the re-distribution interconnects 346 are connected to the solder balls 341. The connection conductors 344 and the re-distribution interconnects 346 can include, for example, copper (Cu), tungsten (W), titanium (Ti), tantalum (Ta), titanium-tungsten alloy (TiW), polysilicon, or the like.

Also, a solder mask (solder resist) 347 is formed in such a manner as to cover the re-distribution interconnects 346 and the insulating film 343 on the side of the lower surface of the second substrate 211 except in the region where the solder balls 341 are formed.

As described above, the solid-state imaging element package 51 illustrated in FIG. 8 formed as a WL-CSP differs in configuration of the input/output section of the solid-state imaging element 1 from the solid-state imaging element package 51 according to the first embodiment.

However, the solid-state imaging element package 51 illustrated in FIG. 8 has no light-shielding film 131 in the region on the lower surface of the rib structure 69 as in the first embodiment. Accordingly, the solid-state imaging element package 51 formed as a WL-CSP can also suppress occurrence of flares.

9. Configuration Example of the Third Embodiment of the Solid-State Imaging Element Package FIG. 9 is a sectional view illustrating a configuration example of a third embodiment of a solid-state imaging element package.

Figure 9:
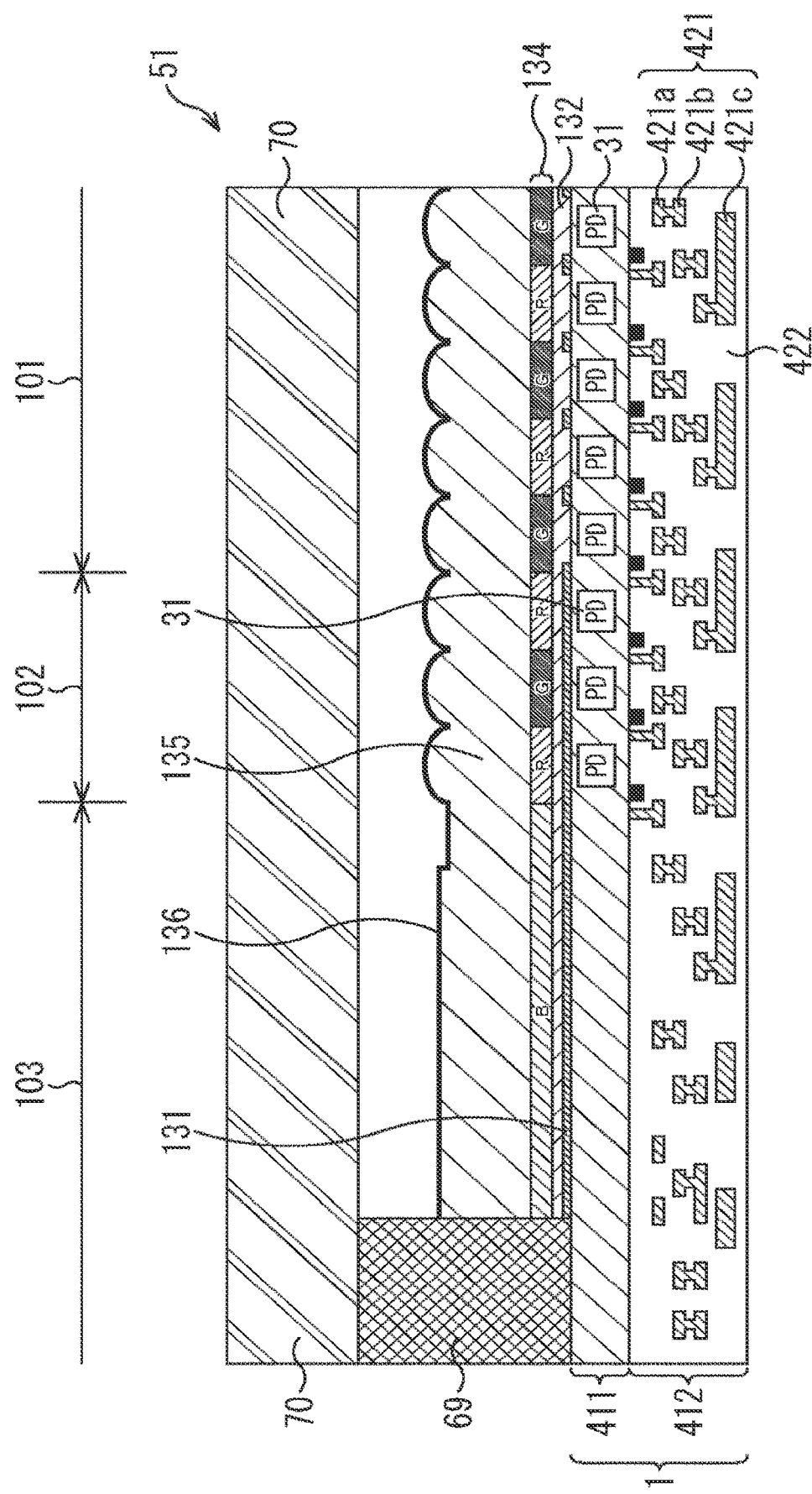
FIG. 9 is a sectional view illustrating a configuration example of a third embodiment of a solid-state imaging element package.

As with FIG. 4 illustrating the first embodiment, FIG. 9 illustrates a sectional view of part of the solid-state imaging element package 51 including sectional portions of the rib structure 69 supporting the cover glass 70. In FIG. 9, the portions corresponding to those in FIG. 4 illustrating the first embodiment are also denoted by the same reference signs, and the description thereof will be omitted as appropriate.

In the first embodiment, the solid-state imaging element 1 had a laminated construction with two semiconductor substrates pasted together. The solid-state imaging element 1 of the third embodiment has a construction with a single semiconductor substrate.

Specifically, the solid-state imaging element package 51 illustrated in FIG. 9 has the solid-state imaging element 1 that includes a semiconductor substrate 411 and a multi-layer interconnect layer 412, and the upper side of the solid-state imaging element 1, the light-receiving side, is covered with the cover glass 70. The rib structure 69 is formed at a peripheral portion of a predetermined width from an edge surface (lateral surface) of the periphery of the solid-state imaging element 1 on the semiconductor substrate 411, thus supporting the cover glass 70.

The photodiodes 31, formed by PN junction, are formed, one for each pixel 21, in the semiconductor substrate 411 of the effective pixel region 101 and the OPB pixel region 102. The multi-layer interconnect layer 412 including a plurality of interconnect layers 421 and an interlayer insulating film 422 formed between each pair of the interconnect layers 421 is formed on the front side (lower surface in FIG. 9) of the semiconductor substrate 411. Also, although not illustrated, not only the plurality of pixel transistors such as the transfer transistors 32 and the amplifying transistors 35 but also the FDs 33 and the like are formed at the interface between the multi-layer interconnect layer 412 and the semiconductor substrate 411. Although the multi-layer interconnect layer 412 includes four layers of interconnects 421 including an interconnect layer 421a in an uppermost layer closest to the semiconductor substrate 411, an intermediate interconnect layer 421b, and an interconnect layer 421c in a lowermost layer in the example illustrated in FIG. 9, the number of interconnect layers 421 is not limited thereto.

Materials of the same kind as those used as the interconnect layers 221 and the interlayer insulating film 222 may be used as the interconnect layers 421 and the interlayer insulating film 422. Also, the plurality of interconnect layers 421 and the interlayer insulating film 422 are similar to the interconnect layers 221 and the interlayer insulating film 222 described above in that they may include a single material or selectively two or more materials.

The light-shielding film 131 is formed on the upper surface of the semiconductor substrate 411 on the back side, the upper side in FIG. 9, as in the first embodiment. The light-shielding film 131 is formed as a pixel-to-pixel light-shielding film in the effective pixel region 101 and as an OPB light-shielding film in the OPB pixel region 102. Then, the light-shielding film 131 is formed in the peripheral circuit region 103 more on the side of the effective pixel region 101 than the region where the rib structure 69 is formed. However, no light-shielding film 131 is formed in the region where the rib structure 69 is formed.

The planarizing film 132 is formed on the upper side of the light-shielding film 131, and the color filter layer 134 and the OCL layer 135 are formed on the upper surface of the planarizing film 132. The anti-reflection film 136 is formed on the upper surface of the OCL layer 135.

Figure 10:
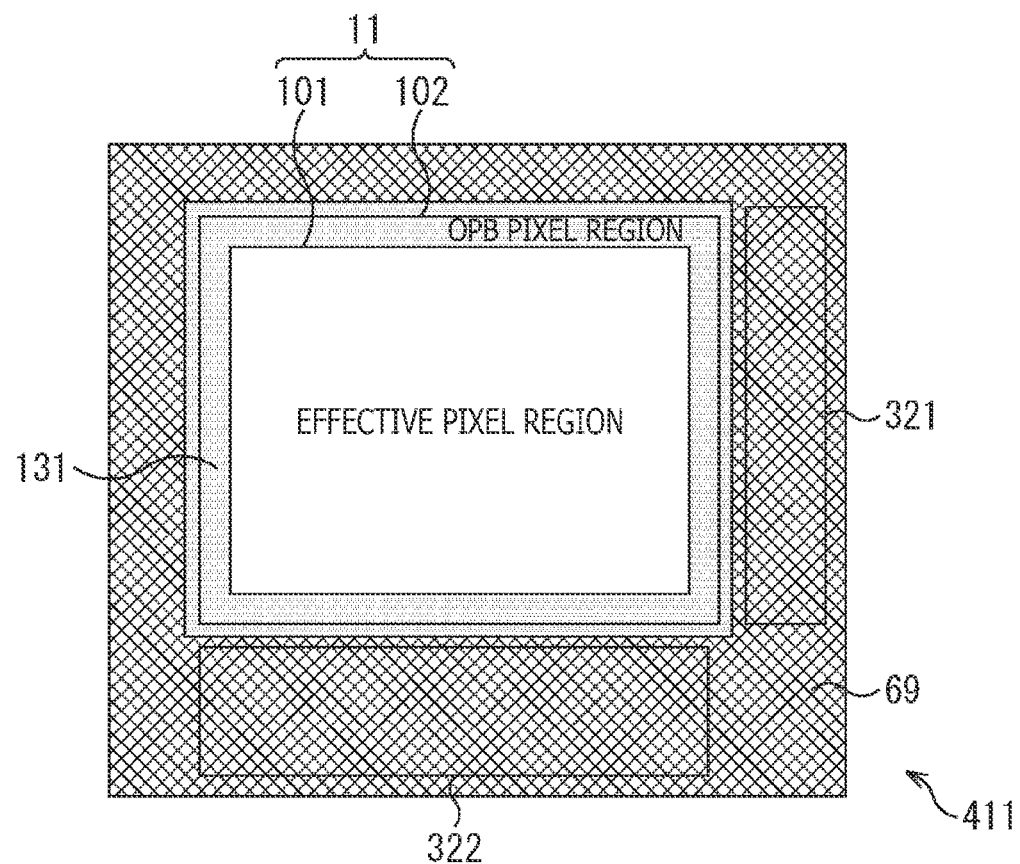
FIG. 10 is a plan view illustrating a layout of each region formed on a semiconductor substrate.

FIG. 10 is a plan view of the semiconductor substrate 411 illustrating a layout of each region formed on the semiconductor substrate 411.

On the semiconductor substrate 411, the effective pixel region 101 of the pixel array section 11 is disposed at the center portion whereas the OPB pixel region 102 is disposed outside the effective pixel region 101. Then, the peripheral circuit region 103 (not depicted in FIG. 10) spans from outside the OPB pixel region 102 to the edge portion of the semiconductor substrate 411.

The regions colored in gray, i.e., the OPB pixel region 102 and part of the peripheral circuit region 103 adjacent thereto, represent the regions where the light-shielding film 131 is formed. It should be noted that the portion as a pixel-to-pixel light-shielding film in the effective pixel region 101 is not colored in gray. The region spanning from outside the region where the light-shielding film 131 colored in gray is formed to the outermost edge portion of the semiconductor substrate 411 is where the rib structure 69 is formed, and no light-shielding film 131 is formed in the region where the rib structure 69 is formed.

The row driving section region 321 and the column signal processing region 322 are disposed in the vicinity of two of the four sides of the periphery of the pixel array section 11. More specifically, the row driving section region 321 having circuitry of the row driving section 14 formed therein is disposed at a position adjacent to the row direction of the pixel array section 11, and the column signal processing region 322 having circuitry including the column signal processing section 12 and the horizontal scan circuit section 15 formed therein is disposed at a position adjacent to the column direction of the pixel array section 11. The row driving section region 321 and the column signal processing region 322 correspond to the regions under which the rib structure 69 is formed.

As described above, even in the case where the solid-state imaging element 1 includes the single semiconductor substrate 411, the solid-state imaging element package 51 has no light-shielding film 131 formed in the region under the rib structure 69 supporting the cover glass 70 (opposite side of the light incident surface). This suppresses occurrence of flares.

10. Example of Application to Electronic Equipment

The present technology is not limited in application to a solid-state imaging element. That is, the present technology is applicable to electronic equipment in general using a solid-state imaging element as its image capture section (photoelectric conversion section) including an imaging apparatus such as a digital still camera or a video camera, a mobile terminal apparatus having an imaging function, and a copier using a solid-state imaging element as its image reading section. The solid-state imaging element may be in a single-chip form or in a modular form having an imaging function with its imaging section, signal processing section, and optics packaged together.

Figure 11:
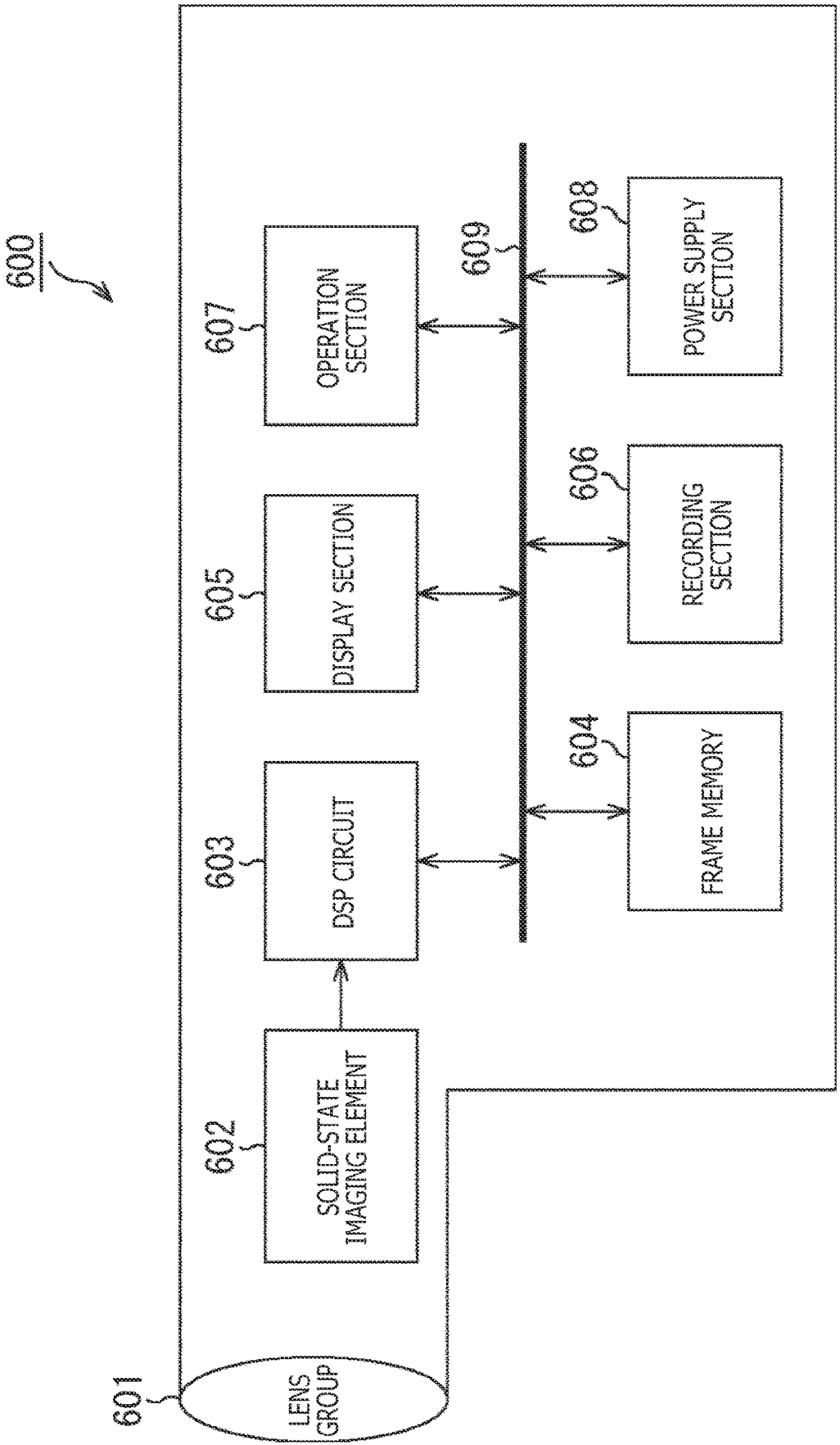
FIG. 11 is a block diagram illustrating a configuration example of an imaging apparatus as electronic equipment to which the present technology is applied.

FIG. 11 is a block diagram illustrating a configuration example of an imaging apparatus as electronic equipment to which the present technology is applied.

An imaging apparatus 600 illustrated in FIG. 11 includes an optical section 601 including a group of lenses, a solid-state imaging element (imaging device) 602, and a DSP (Digital Signal Processor) circuit 603, a camera signal processing circuit. Also, the imaging apparatus 600 includes a frame memory 604, a display section 605, a recording section 606, an operation section 607, and a power supply section 608. The DSP circuit 603, the frame memory 604, the display section 605, the recording section 606, the operation section 607, and the power supply section 608 connected to each other via a bus line 609.

The optical section 601 loads incident light (image light) from a subject to form an image on an imaging surface of the solid-state imaging element 602. The solid-state imaging element 602 converts an amount of incident light whose image has been formed on the imaging surface by the optical section 601 into an electric signal on a pixel basis and outputs the electric signal as a pixel signal. The solid-state imaging element package 51 having the solid-state imaging element 1 packaged therein can be used as the solid-state imaging element 602.

The display section 605 includes, for example, a slim display such as an LCD (Liquid Crystal Display) or an organic EL (Electro Luminescence) display and displays a video or still image captured by the solid-state imaging element 602. The recording section 606 records the video or still image captured by the solid-state imaging element 602 to a recording medium such as a hard disk or a semiconductor memory.

The operation section 607 issues operation instructions regarding various functions of the imaging apparatus 600 under operations of a user. The power supply section 608 supplies, as appropriate, various types of power, operating power, to the DSP circuit 603, the frame memory 604, the display section 605, the recording section 606, and the operation section 607.

As described above, it is possible to suppress occurrence of flares by using, as the solid-state imaging element 602, the solid-state imaging element package 51 having the solid-state imaging element 1 packaged therein and having no light-shielding film 131 formed in the region under the rib structure 69. This provides enhanced quality of captured images for the imaging apparatuses 600 ranging from video camera and digital still camera to camera modules for mobile equipment such as a mobile phone.

Usage Example of the Image Sensor

Figure 12:
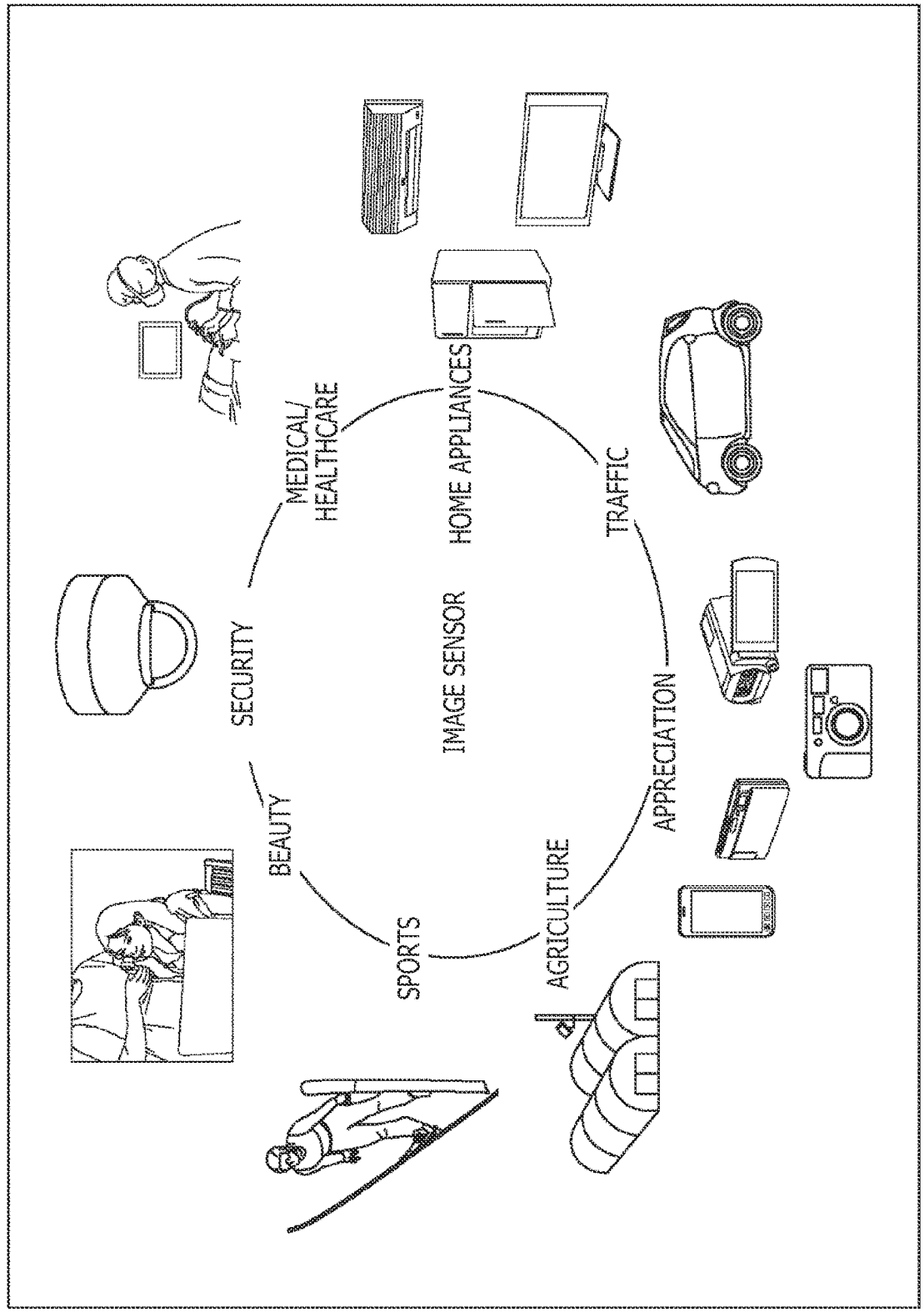
FIG. 12 is a diagram illustrating a usage example of an image sensor.

FIG. 12 is a diagram illustrating a usage example of an image sensor using the solid-state imaging element package 51 described above.

The image sensor using the solid-state imaging element package 51 described above can apply in various cases of sensing visible light, infrared light, ultraviolet light, X-ray, and other types of light, for example, as described below.

Apparatuses for capturing images for appreciation such as a digital camera and a mobile phone having a camera function Apparatuses for traffic use such as a vehicle-mounted sensor for capturing front, back, surroundings, inside, and so on of an automobile for safe driving such as automatic stop and for recognition of driver's state, a surveillance camera for monitoring traveling vehicles and road, and a distance measuring sensor for measuring vehicle-to-vehicle distance and so on Apparatuses for use in home electric appliances such as a TV, a refrigerator, and an air-conditioner to capture a user's gesture and operate the appliance according to the gesture Apparatuses for medical and healthcare use such as an endoscope and an apparatus for capturing blood vessels by receiving infrared light Apparatuses for security use such as a surveillance camera for crime prevention and a camera for individual authentication Apparatuses for cosmetic use such as a skin measuring device for capturing skin and a microscope for capturing scalp Apparatuses for sports use such as an action camera and a wearable camera for sports applications Apparatuses for agricultural use such as a camera for monitoring fields and crops 11. Example of Application to Mobile Object The technology according to the present disclosure (the present technology) is applicable to a variety of products. For example, the technology according to the present disclosure may be realized as an apparatus mounted to any one type of mobile object among an automobile, an electric vehicle, a hybrid electric vehicle, a motorcycle, a bicycle, a personal mobility, an airplane, a drone, a ship, a robot, and the like.

Figure 13:
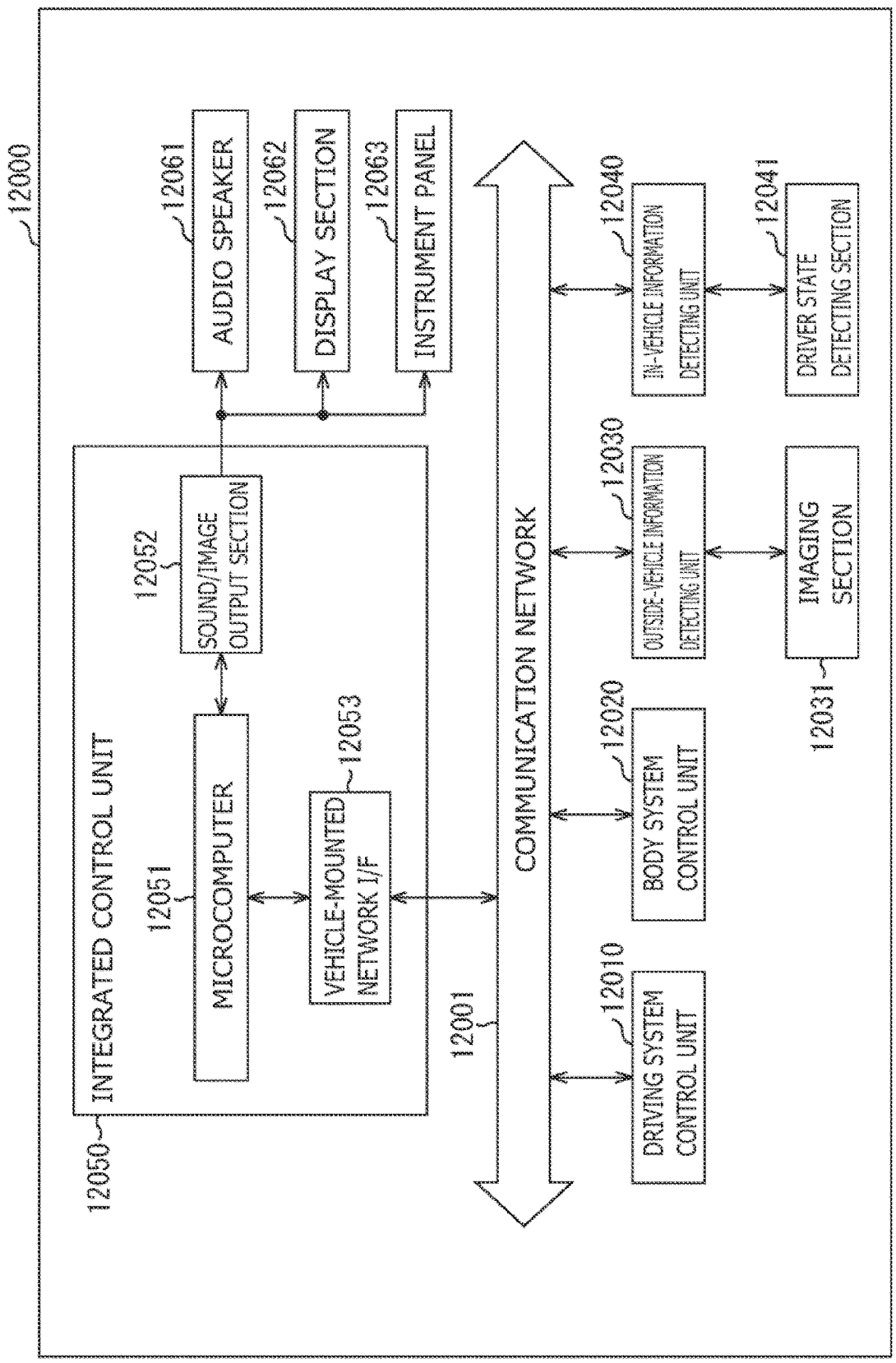
FIG. 13 is a block diagram depicting an example of schematic configuration of a vehicle control system.

FIG. 13 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 13, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 13, an audio speaker 12061, a display section 12062, and an instrument panel 12063 are illustrated as the output device. The display section 12062 may, for example, include at least one of an on-board display and a head-up display.

Figure 14:
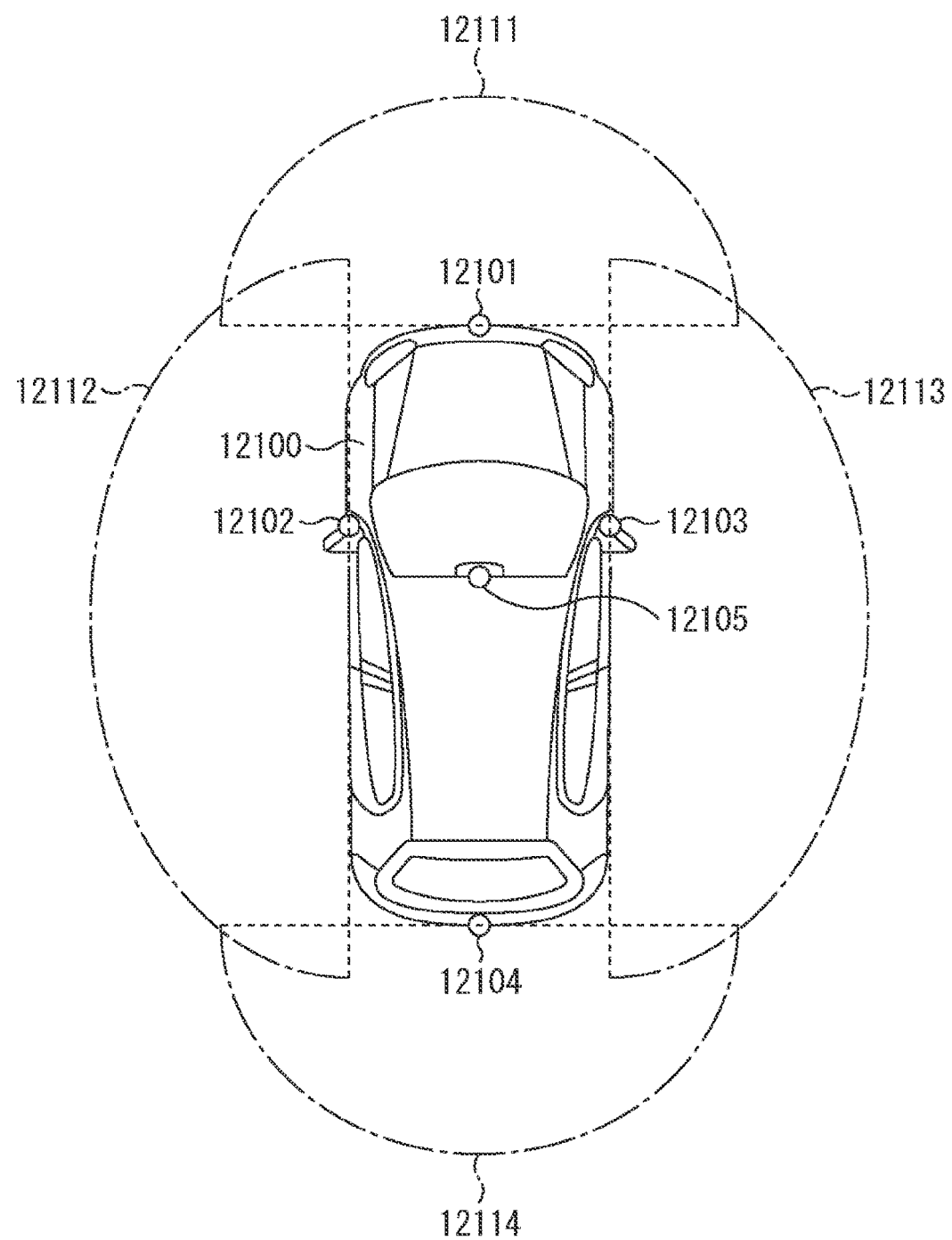
FIG. 14 is a diagram of assistance in explaining an example of installation positions of an outside-vehicle information detecting section and an imaging section.

FIG. 14 is a diagram depicting an example of the installation position of the imaging section 12031.

In FIG. 14, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 14 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure is applicable has been described above. The technology according to the present disclosure is applicable, of the components described above, to the imaging section 12031. Specifically, each of the embodiments of the solid-state imaging element package 51 described above is applicable as the imaging section 12031. The application of the technology according to the present disclosure to the imaging section 12031 suppresses occurrence of flares, thus allowing for acquisition of easier-to-see captured images and distance information. Also, driver's fatigue can be alleviated, and driver and vehicle safety enhanced by using the captured images and distance information acquired.

Also, the present technology is not limited in application to a solid-state imaging element that captures an image by detecting a distribution of the amount of incident visible light and is applicable not only to a solid-state imaging element that captures the distribution of the amount of incident infrared rays, X rays, particle beams, or the like as an image but also, in a broad sense, to solid-state imaging elements (physical quantity distribution detection apparatuses) in general such as a fingerprint detection sensor that capture an image by detecting the distribution of other physical quantity such as pressure or capacitance.

Embodiments of the present technology are not limited to those described above and can be modified in various ways without departing from the gist of the present technology.

For example, the plurality of embodiments described above can be wholly or partly combined as appropriate.

Although a description is given above of a laminated construction having two semiconductor substrates pasted together and another construction using a single semiconductor substrate as substrate constructions of the solid-state imaging element 1, the solid-state imaging element 1 having three or more semiconductor substrates may also be formed.

Also, in the embodiments of the solid-state imaging element described above, a description is given of the construction of only a back-illuminated solid-state imaging element into which incident light enters from the back side opposite to the front side where the multi-layer interconnect layer of the semiconductor substrate is formed. However, the present technology can be realized similarly in the construction of a front-illuminated solid-state imaging element. In that case, in the region where the rib structure 69 is formed, no light-shielding film 131 is formed at the same time and in the same layer as the pixel-to-pixel light-shielding film and the OPB light-shielding film, either.

It should be noted that the advantageous effects described in the present specification are merely illustrative and not restrictive and that there may be advantageous effects other than those described in the present specification.

It should be noted that the present technology can also have the following configurations:

(1)
A solid-state imaging element including:
an effective pixel region having a plurality of pixels arranged two-dimensionally in a matrix pattern; and
a peripheral circuit region provided around the effective pixel region, in which
the effective pixel region has a pixel-to-pixel light-shielding film formed at boundary portions between the pixels, and,
in a region on a substrate where a rib structure is formed within the peripheral circuit region, no light-shielding film is formed in the same layer as the pixel-to-pixel light-shielding film.

(2)
The solid-state imaging element of feature (1), in which the rib structure is a structure that supports a transparent substrate.

(3)
The solid-state imaging element of feature (1) or (2), in which the rib structure includes a resin material having an attenuation coefficient.

(4)

The solid-state imaging element of any one of features (1) to (3), further including:
   an OPB pixel region between the effective pixel region and the peripheral circuit region, in which
   a light-shielding film is formed in the same layer as the pixel-to-pixel light-shielding film in the OPB pixel region.

(5)

The solid-state imaging element of any one of features (1) to (4), in which
   at least two semiconductor substrates are pasted together to form the solid-state imaging element.

(6)

The solid-state imaging element of feature (5), in which
   a first semiconductor substrate having the rib structure is formed thereon,
   a second semiconductor substrate having circuitry that acts as floating nodes during a charge accumulation period is formed thereon, the first and second semiconductor substrates being pasted together, and
   the circuitry is formed in a region more inward than a region where the rib structure is formed on the first semiconductor substrate.

(7)

The solid-state imaging element of any one of features (1) to (6), in which
   the solid-state imaging element is a back-illuminated solid-state imaging element.

(8)

The solid-state imaging element of any one of features (1) to (4) or (7), in which
   the solid-state imaging element has a construction with a single semiconductor substrate.

(9)

The solid-state imaging element of any one of features (1) to (8), further including:
   a multi-layer interconnect layer including a plurality of interconnect layers and an interlayer insulating film, in which
   at least part of the interlayer insulating film includes a porous low-k material.

(10)

A solid-state imaging element package including:
   a solid-state imaging element;
   a transparent substrate adapted to protect the solid-state imaging element; and
   a rib structure formed on a substrate of the solid-state imaging element to support the transparent substrate,
   the solid-state imaging element including
      an effective pixel region having a pixel-to-pixel light-shielding film formed at boundary portions between the pixels, and
      a peripheral circuit region provided around the effective pixel region, in which,
   in a region on the substrate where the rib structure is formed within the peripheral circuit region, no light-shielding film is formed in the same layer as the pixel-to-pixel light-shielding film.

(11)

The solid-state imaging element package of feature (10), in which
   a bonding wire connected to a pad of the solid-state imaging element is disposed in such a manner as to penetrate the rib structure.

(12)

The solid-state imaging element package of feature (10) or (11), in which
   a pad formed on the solid-state imaging element and the rib structure are disposed side by side in a planar direction, and
   the pad is disposed more on a side of a periphery than the rib structure.

(13)

The solid-state imaging element package of any one of features (10) to (12), in which
   the solid-state imaging element package is formed as a WL-CSP.

(14)

The solid-state imaging element package of any one of features (10) to (13), in which
   the solid-state imaging element has a laminated construction including at least two semiconductor substrates pasted together.

(15)

The solid-state imaging element package of feature (14), in which
   a first semiconductor substrate having the rib structure is formed thereon,
   a second semiconductor substrate having circuitry that acts as floating nodes during a charge accumulation period is formed thereon, the first and second semiconductor substrates being pasted together, and
   the circuitry is formed in a region more inward than a region where the rib structure is formed on the first semiconductor substrate.

(16)

The solid-state imaging element package of any one of features (10) to (15), in which
   the solid-state imaging element is a back-illuminated solid-state imaging element.

(17)

The solid-state imaging element package of any one of features (10) to (13) or (16), in which
   the solid-state imaging element has a construction with a single semiconductor substrate.

(18)

The solid-state imaging element package of any one of features (1) to (17), further including:
   a multi-layer interconnect layer including a plurality of interconnect layers and an interlayer insulating film, in which,
   at least part of the interlayer insulating film includes a porous low-k material.

(19)

Electronic equipment including:
   a solid-state imaging element including
      an effective pixel region having a plurality of pixels arranged two-dimensionally in a matrix pattern, and
      a peripheral circuit region provided around the effective pixel region,
   the effective pixel region having a pixel-to-pixel light-shielding film formed at boundary portions between the pixels,
   in a region on a substrate where a rib structure is formed within the peripheral circuit region, no light-shielding film being formed in the same layer as the pixel-to-pixel light-shielding film.

REFERENCE SIGNS LIST

1: Solid-state imaging element
11: Pixel array section
12: Column signal processing section
14: Row driving section
16: Reference signal generation section
16a: DAC
21: Pixel
24: Constant current source circuit
25: ADC
41, 42: Capacitive element
51: Solid-state imaging element package
65, 66: Pad
67: Bonding wire
68: Mold resin
69: Rib structure
70: Cover glass
101: Effective pixel region
102: OPB pixel region
103: Peripheral circuit region
111: First substrate
112: Multi-layer interconnect layer
122: Interlayer insulating film
131: Light-shielding film
211: Second substrate
212: Multi-layer interconnect layer
222: Interlayer insulating film
411: Semiconductor substrate
412: Multi-layer interconnect layer
422: Interlayer insulating film
600: Imaging apparatus
602: Solid-state imaging element

What is claimed is:

1. A solid-state imaging element, comprising:
an effective pixel region having a plurality of pixels arranged two-dimensionally in a matrix pattern; and
a peripheral circuit region provided around the effective pixel region, wherein
the effective pixel region has a pixel-to-pixel light-shielding film formed at boundary portions between the pixels, and,
in a region on a substrate where a rib structure is formed within the peripheral circuit region, no light-shielding film is formed in a same layer as the pixel-to-pixel light-shielding film.

2. The solid-state imaging element of claim 1, wherein the rib structure is a structure that supports a transparent substrate.

3. The solid-state imaging element of claim 1, wherein the rib structure includes a resin material having an attenuation coefficient.

4. The solid-state imaging element of claim 1, further comprising:
an OPB pixel region between the effective pixel region and the peripheral circuit region, wherein
a light-shielding film is formed in the same layer as the pixel-to-pixel light-shielding film in the OPB pixel region.

5. The solid-state imaging element of claim 1, wherein at least two semiconductor substrates are pasted together to form the solid-state imaging element.

6. The solid-state imaging element of claim 5, wherein
a first semiconductor substrate having the rib structure is formed thereon,
a second semiconductor substrate having circuitry that acts as floating nodes during a charge accumulation period is formed thereon, the first and second semiconductor substrates being pasted together, and
the circuitry is formed in a region more inward than a region where the rib structure is formed on the first semiconductor substrate.

7. The solid-state imaging element of claim 1, wherein the solid-state imaging element is a back-illuminated solid-state imaging element.

8. The solid-state imaging element of claim 1, wherein the solid-state imaging element has a construction with a single semiconductor substrate.

9. The solid-state imaging element of claim 1, further comprising:
a multi-layer interconnect layer including a plurality of interconnect layers and an interlayer insulating film, wherein
at least part of the interlayer insulating film includes a porous low-k material.

10. A solid-state imaging element package, comprising:
a solid-state imaging element;
a transparent substrate adapted to protect the solid-state imaging element; and
a rib structure formed on a substrate of the solid-state imaging element to support the transparent substrate,
the solid-state imaging element including
an effective pixel region having a pixel-to-pixel light-shielding film formed at boundary portions between the pixels, and
a peripheral circuit region provided around the effective pixel region, wherein,
in a region on the substrate where the rib structure is formed within the peripheral circuit region, no light-shielding film is formed in a same layer as the pixel-to-pixel light-shielding film.

11. The solid-state imaging element package of claim 10, wherein
a bonding wire connected to a pad of the solid-state imaging element is disposed in such a manner as to penetrate the rib structure.

12. The solid-state imaging element package of claim 10, wherein
a pad formed on the solid-state imaging element and the rib structure are disposed side by side in a planar direction, and
the pad is disposed more on a side of a periphery than the rib structure.

13. The solid-state imaging element package of claim 10, wherein
the solid-state imaging element package is formed as a WL-CSP.

14. The solid-state imaging element package of claim 10, wherein
the solid-state imaging element has a laminated construction including at least two semiconductor substrates pasted together.

15. The solid-state imaging element package of claim 14, wherein
a first semiconductor substrate having the rib structure is formed thereon,
a second semiconductor substrate having circuitry that acts as floating nodes during a charge accumulation period is formed thereon, the first and second semiconductor substrates being pasted together, and
the circuitry is formed in a region more inward than a region where the rib structure is formed on the first semiconductor substrate.

16. The solid-state imaging element package of claim 10, wherein
the solid-state imaging element is a back-illuminated solid-state imaging element.

17. The solid-state imaging element package of claim 10, wherein
the solid-state imaging element has a construction with a single semiconductor substrate.

18. The solid-state imaging element package of claim 10, further comprising:
a multi-layer interconnect layer including a plurality of interconnect layers and an interlayer insulating film, wherein,
at least part of the interlayer insulating film includes a porous low-k material.

19. Electronic equipment comprising:
a solid-state imaging element including
an effective pixel region having a plurality of pixels arranged two-dimensionally in a matrix pattern, and
a peripheral circuit region provided around the effective pixel region,
the effective pixel region having a pixel-to-pixel light-shielding film formed at boundary portions between the pixels,
in a region on a substrate where a rib structure is formed within the peripheral circuit region, no light-shielding film being formed in a same layer as the pixel-to-pixel light-shielding film.

* * * * *